(12) United States Patent
Estrada et al.

(10) Patent No.: US 8,514,919 B2
(45) Date of Patent: Aug. 20, 2013

(54) SYNTHETIC INSTRUMENT UNIT

(75) Inventors: Anthony J. Estrada, San Diego, CA (US); Dana C. Ford, Santee, CA (US); Tae S. Kim, San Diego, CA (US); Robert W. Lowdermilk, San Diego, CA (US); Dragan Vuletic, San Diego, CA (US)

(73) Assignee: BAE Systems National Security Solutions Inc., San Diego, CA (US)

( * ) Notice: Subject to any disclaimer, the term of this patent is extended or adjusted under 35 U.S.C. 154(b) by 175 days.

(21) Appl. No.: 13/126,127

(22) PCT Filed: Aug. 25, 2010

(86) PCT No.: PCT/US2010/046615
§ 371 (c)(1),
(2), (4) Date: Apr. 26, 2011

(87) PCT Pub. No.: WO2011/025817
PCT Pub. Date: Mar. 3, 2011

(65) Prior Publication Data
US 2012/0020397 A1 Jan. 26, 2012

Related U.S. Application Data

(60) Provisional application No. 61/236,913, filed on Aug. 26, 2009.

(51) Int. Cl.
*H04B 17/00* (2006.01)
(52) U.S. Cl.
USPC ........ 375/224; 375/228; 375/340; 455/226.1; 324/76.14; 324/76.19; 324/76.2; 324/76.21; 324/76.22; 324/76.23; 324/76.24; 324/76.25; 324/76.26; 324/318; 324/510; 702/66; 702/70; 702/75; 702/76

(58) Field of Classification Search
CPC . H04L 12/2697; H04L 43/50; G01R 19/2416
USPC ............... 375/224, 228, 340, 28; 455/226.1; 324/318, 510, 76.14, 76.19, 76.2, 76.21, 324/76.22, 76.23, 76.24; 702/70, 75, 76, 702/0.66
See application file for complete search history.

(56) References Cited

U.S. PATENT DOCUMENTS 6,356,067 B1 * 3/2002 Nara .......................... 324/76.23
6,931,241 B2 8/2005 Khlat et al.
(Continued)

OTHER PUBLICATIONS

Phase Matrix "VXIbus Microwave Downconverter", Feb. 5, 2008, pp. 1-7.*

(Continued)

*Primary Examiner* — Sophia Vlahos
(74) *Attorney, Agent, or Firm* — Sand & Sebolt; Daniel J. Long

(57) ABSTRACT

Systems and other embodiments associated with synthetic instrumentation are presented. A reconfigurable synthetic instrumentation unit comprises an input module, with dual input/output ports and conditioning logic to condition an input signal. An RF down converter selectively down converts the conditioned input signal. A sampled RF down converter selectively samples the conditioned input signal. A pair of narrowband A/D converters are configured to convert one of the conditioned signal, the down converted signal and the sampled signal to produce a narrowband digital signal. A pair of broadband A/D converters convert at least one of the conditioned signal, the down converted signal and the sampled signal to produce a broadband digital signal. Signal processing logic selectively performs digital signal processing on the broadband digital signal or the narrow band digital signal.

20 Claims, 15 Drawing Sheets

(56) References Cited

U.S. PATENT DOCUMENTS

| | | | |
|---|---|---|---|
| 7,058,377 | B1 | 6/2006 | Mitsdarffer et al. |
| 7,449,876 | B2* | 11/2008 | Pleasant et al. .............. 324/76.19 |
| 7,894,788 | B2* | 2/2011 | Keehr et al. ..................... 455/296 |
| 8,290,456 | B2* | 10/2012 | Nejah ......................... 455/150.1 |
| 2004/0008654 | A1* | 1/2004 | Klein et al. .................... 370/338 |
| 2004/0014474 | A1* | 1/2004 | Kanada .......................... 455/444 |
| 2006/0148472 | A1* | 7/2006 | Bradley .......................... 455/434 |
| 2007/0257660 | A1 | 11/2007 | Pleasant et al. |
| 2008/0255818 | A1 | 10/2008 | Jefferson et al. |
| 2009/0075610 | A1* | 3/2009 | Keehr et al. .................... 455/137 |

OTHER PUBLICATIONS

Rozner, M. NxTest and the Development of Synthetic Instrumentation. RF Design, pp. 6, 8, 9, 10. Feb. 2005. Retrieved from the internet [retrieved on Aug. 30, 2011]: <URL: http://rfdesign.com/ar/0205rfdefensef1.pdf>. Entire Document.

Granieri et al. A Flexible Family of PXI RF/MW Down Coverter Modules. IEEE AUTOTESTCON Sep. 8, 2008. Retrieved from the internet [retrieved on Aug. 30, 2011]: <URL: http://phasematrix.com/Articles/PXI_autotestcon07.pdf>. Entire Document.

Ravindran, M. Cabled PCI Express—A Standard High-Speed Instrument Interconnect. IEEE AUTOTESTCON Sep. 17, 2007. Retrieved from the internet [retrieved on Aug. 30, 2011]: <URL: http://img3.zhubajie.com/task/2010-03/04/237456/lzd2q0cz.pdf>. Entire Document.

Lund. The Agile Rapid Global Combat Support (ARGCS) System: A Cost and Benefit Analysis of Including the ARCHS Technologies in the Acquisition of the Enhanced Consolidated Support System (ECASS). Naval Postgraduate School Thesis. Sep. 2007. Retrieved from the internet [retrieved on Aug. 30, 2011]: <URL: http://edocs.nps.edu/npspubs/scholarly/theses/2007/Dec/07Dec_Lund.pdf. Entire Document.

* cited by examiner

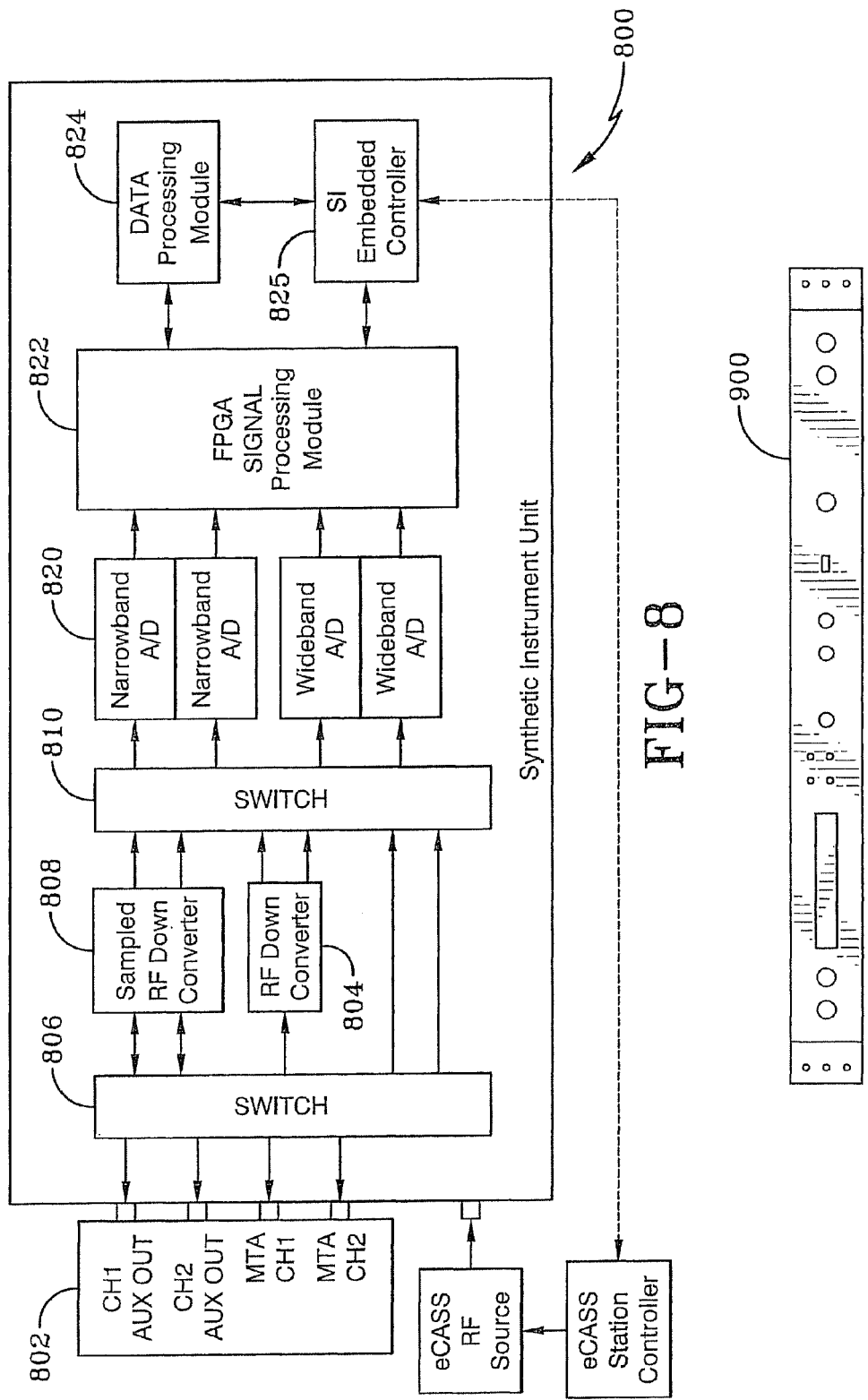

SYNTHETIC INSTRUMENT UNIT

CROSS REFERENCE TO RELATED APPLICATIONS

This application claims priority from PCT Patent Application No. PCT/US2010/046615, filed Aug. 25, 2010, which claims priority from U.S. Provisional Patent Application Ser. No. 61/236,913, filed Aug. 26, 2009.

BACKGROUND OF THE INVENTION

1. Technical Field

The present invention relates generally to apparatus, methods and systems for testing electronic equipment. More particularly, the apparatus, methods and systems related to synthetic instruments for testing electronic equipment. Specifically, the apparatus, methods and systems of the present invention relate to synthetic instruments based vector network analyzer for testing electronic equipment.

2. Background Information

The previous generations of aviation support equipment dating back over the past forty years (i.e., VAST, CASS) show that continuous change in avionics and test technology is inevitable. "Technology gallop" as well as the changing mission landscape in terms of units under test (UUTs) to be supported in the future is ever changing. This dynamic situation often results in a mismatch between the operational units to be supported in the field and the test support systems required to RFI and diagnose these systems.

In the past, naval aviation in the United States has generally relied on a combination of conventional rack and stack test equipment and special roll-ups or test benches to fulfill the test requirements of this dynamic support environment. This situation has often resulted in inflexible, redundant, and costly hardware centric solutions that are often both difficult to support and prone to obsolescence due to the "technology gallop" previously mentioned. In fact, the greatest challenge to the eCASS program is its ability to both satisfy legacy support requirements while at the same time keep in sync with and satisfying future/emerging requirements, in order to keep eCASS technically viable and relevant going forward. This is a daunting challenge, especially in the RF/MW arena where the testing requirements can often be complex and exacting. Clearly a new paradigm is required that provides a pragmatic solution to this challenge. There is need for better synthetic instrumentation.

SUMMARY

A reconfigurable synthetic instrumentation unit comprises an input module, with dual input/output ports and conditioning logic to condition an input signal. An RF down converter selectively down converts the conditioned input signal. A sampled RF down converter selectively samples the conditioned input signal. A pair of narrowband A/D converters are configured to convert at least one of the conditioned signal, the down converted signal and the sampled signal to produce a narrowband digital signal. A pair of broadband A/D converters convert at least one of the conditioned signal, the down converted signal and the sampled signal to produce a broadband digital signal. Signal processing logic selectively performs digital signal processing on the broadband digital signal and/or the narrow band digital signal.

In one configuration, the signal processing logic can be configured to perform Fast Fourier Transform (FFT) based spectrum analysis and later be configured to perform swept frequency spectrum analysis. In another configuration, the synthetic instrument unit can be configured as a microwave transition analyzer (MTA) by coupling the synthetic instrument unit with a dual-channel RF sampled down converter (SDC). The synthetic instrument unit can also be configured as an MTA configured to measure vector based signals. Alternatively, the synthetic instrument unit can be configured to measure vector amplitude, phase difference, vector power, forward transmission and/or forward reflection.

In another configuration, the synthetic instrument unit can be mounted within an extension for Instrumentation (PXI) Express chassis with at least one peripheral component interconnect PCI Express bus. The synthetic instrument unit is coupled to the PCI Express bus. A bridge can couple the PXI Express chassis to the synthetic instrument unit for remote communication and control of the synthetic instrument unit. The SIU can include an embedded controller supporting real-time control of the PXI chassis. The embedded controller can further comprise a removable hard drive with memory accessible by the synthetic instrument unit.

The RF down converter can be a Phase Matrix (PHI) down converter configured to translate the conditioned input signal to a wideband IF and/or a narrowband IF. The conditioning logic can perform signal path switching, pre-selection filtering and/or grain control. The synthetic instrument unit is capable of measurement of signals with frequencies from 0 Hz to about 26.5 MHz. The synthetic instrument unit can be configured to be controlled by a station controller over a local area network (LAN). The signal processing logic can be implemented within a field programmable gate array (FPGA).

BRIEF DESCRIPTION OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 8 is a schematic diagram showing the SIU configured for microwave transition analyzer measurements according to one configuration of the preferred embodiment of the present invention.

FIG. 9 is a front plan view of an SIU sampled down converter (SDC) Module according to one configuration of the preferred embodiment of the present invention.

Similar numbers refer to similar parts throughout the drawings.

DETAILED DESCRIPTION OF THE INVENTION

RF measurements capability based on synthetic instrumentation technology can be a solution for the next-generation eCASS ATE due to the flexibility of synthetic instruments to adapt to uncertain and future test requirements. Synthetic instrumentation (SI) can readily adapt to new test requirements because an SI synthesizes the measurement functionality found in traditional instruments via employing a combination of core hardware and Digital signal processing (DSP) software building blocks in a modular open architecture environment. Synthetic instruments are substantially different from classical instruments in that the measurement functions are synthesized from a limited set of "generic" SI components as opposed to discrete instrument types, such as a spectrum analyzer. Users typically interact with a SI via a software-defined Graphical User Interface (GUI) which simulates a front panel for an entire SI, or its constituent components, by providing software "widgets" that emulate the physical knobs, buttons, and displays of classical instrumentation.

SI is predicated on the concept that most measurement functions can be implemented in software employing "Core" SI hardware & software components (Frequency Up/Down Converters, Digital to Analog Converters (DACs), Analog to Digital Converters (ADCs), DSP hardware/software) and supplemented, as required by the user's envelope of test requirements, by COTS hardware (i.e., Power Supplies, fixturing, loads, and switching) and software.

Figure 1:
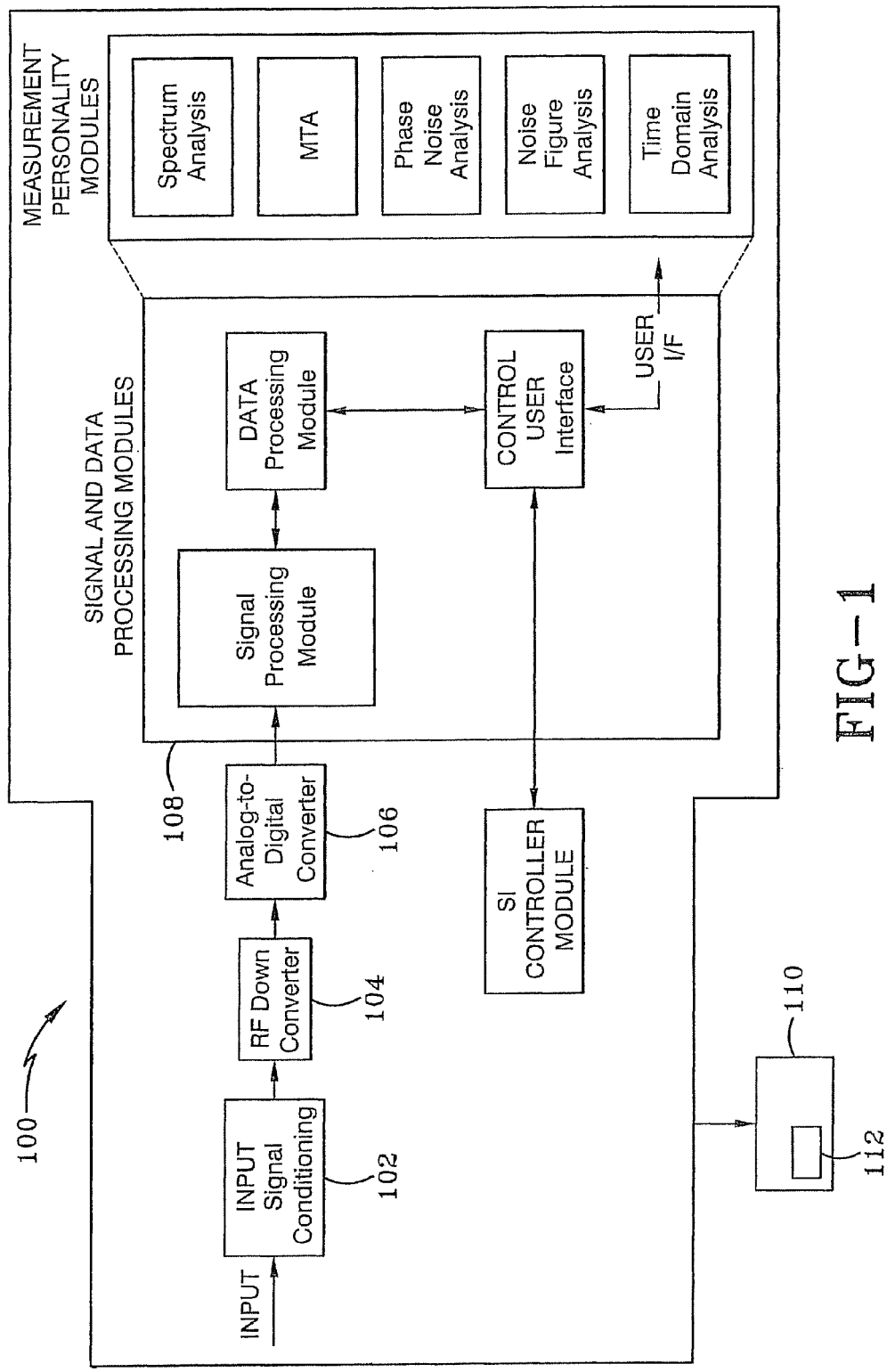
FIG. 1 is a schematic drawing of the preferred embodiment of the synthetic instrument unit.

A high level block diagram of a test system's 100 test and measurement capability predicated on Synthetic Instrumentation is shown in FIG. 1. The receiving or RF-to-digital circuitry link/path is comprised of signal conditioning, frequency down-conversion, and analog-to-digital conversion followed by signal, data and display processing as well as user interfaces. As shown in the figure, the measurement functions are implemented as "Personality Module" software cores that synthesize the desired measurement functions using a combination of high-performance signal processing and data processing modules. Using the common hardware SI assets coupled with software cores, personality modules can synthesize several measurement modes including spectrum analysis and time domain analysis.

In addition, these modules can be optimized to emulate specific instruments such as the obsolete Microwave Transition Analyzer (MTA) presently part of the CASS ATS. Not only can a SI solution duplicate the functionality of these instruments, but the personality module can emulate the performance of the obsolete instrument (in some cases this results in intentional degradation in accuracy and measurement speed due to advances in technology).

Referring back to FIG. 1, the signal conditioning circuitry 102 provides the requisite tasks of signal path switching, pre-selection filtering and gain control. The gain control process controls amplifiers and attenuators in the measurement signal path to scale the analog signal level to the dynamic range of the subsequent processing units.

The down converter 104 functional block is perhaps the most critical component in the measurement path. The down converter must provide the frequency translation/filtering function and, via a combination of mixing and filtering, faithfully reproduce the target Intermediate Frequency (IF) and/or baseband signal that were modulated onto the microwave carrier signal. If the down converter's conversion loss, IF filtering, and associated phase characteristics are not properly specified, designed, and controlled the down-converted IF signal being digitized and analyzed by the Analog-to-Digital Converter (ADC) 106 and DSP software respectively will bear erroneous results.

The ADC 106 in the receiving or measurement processing path is the interface between the continuous analog and discrete sampled digital domain, and limits both the dynamic range and instantaneous bandwidth of the Synthetic Instrument 100. The operating range and speed of the ADC 106 is often the limiting factor in affecting the accuracy and bandwidth of the measurement to be performed, assuming the down converter block is providing the ADC 106 with a faithful reproduction of the target IF baseband signal to be digitized.

A key design parameter in the SI 100 is the ability of the ADC 106 functional block to perform the digitization process and transmit digital data to the DSP software, residing on a high-performance DSP engine 108 (e.g., an embedded host controller or external PC) for analysis in a timely manner. This data transmission must occur at a high data rate to ensure that the DSP software does not miss needed data points and can perform analysis on streaming digitized data in real time or in a near real-time environment for embedded applications. A SI's 100 overall conversion/data transfer rate is a function of the down converter's frequency conversion rate, the ADC's sampling rate and sample size, and 104 the SI implementation environment or data transport/bus mechanism employed—the PXI Express standard, for example.

An overview of the synthetic instrument unit (SIU) 100 is now presented. A streamlined alternative to classic "rack-and-stack" test equipment based on Synthetic Instrumentation is proposed. The SIU 100 of the preferred embodiment is a reconfigurable Synthetic Instrument (SI) based on commercial-off-the-Shelf (COTS) hardware modules that are integrated with software measurement modules to meet specific measurement application requirements.

To achieve very high measurement performance in a compact footprint, the SIU 100 incorporates the latest Small Business Innovative Research (SBIR) technology advances in RF frequency translation developed by Phase Matrix, Inc. with National Instruments' high-speed, high dynamic range analog-to-digital conversion (ADC) technology, coupled with synthetic instrument algorithms implemented on a high-speed PXI Express DSP platform. For example, BAE Systems' SI can now measure multiple test functions from DC through 26.5 GHz, with options extending the frequency coverage to 220 GHz, that have been historically implemented using costly, dedicated test equipment.

Figure 2:
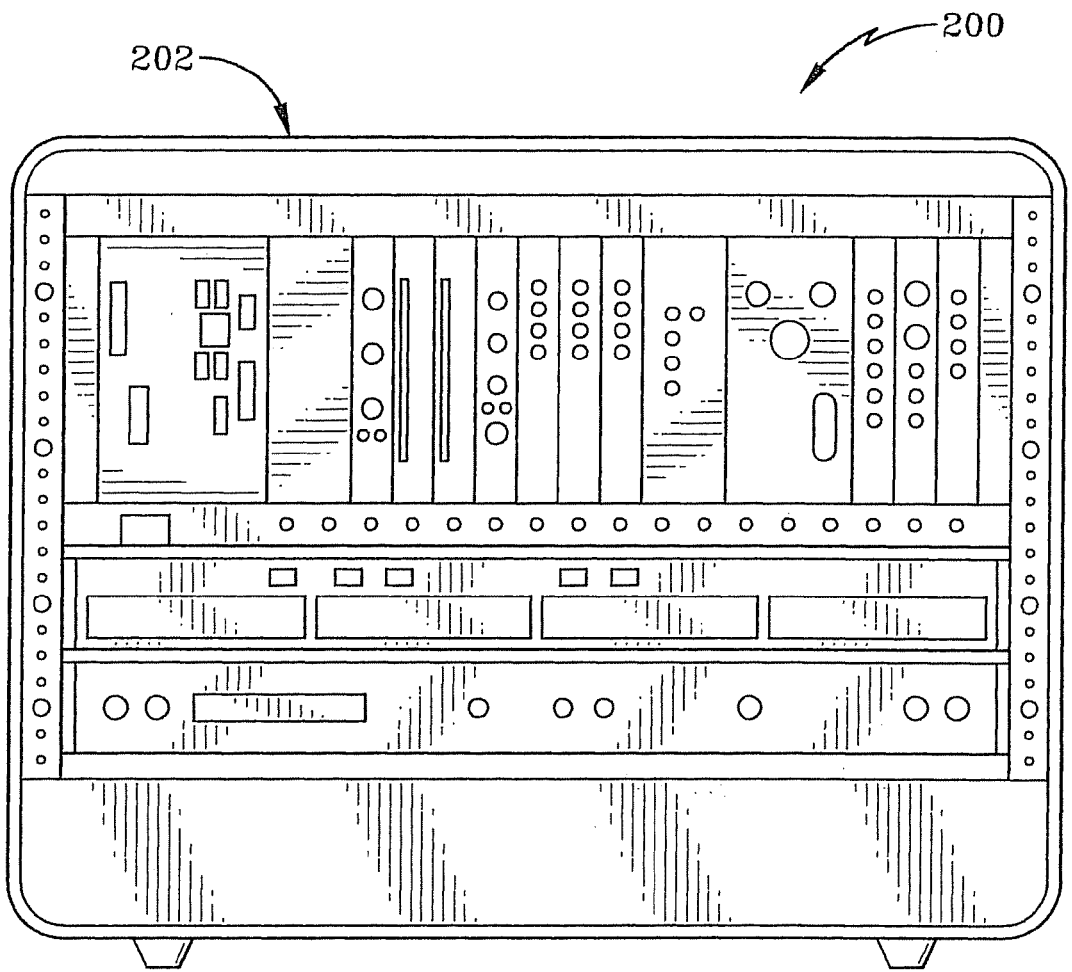
FIG. 2 is a front plan view of a PXIe-based synthetic instrument unit of the preferred embodiment of the present invention.

FIG. 2 depicts the SIU baseline 200 configured as hosted in a single commercial 3 U PXI Express chassis 202 or a set of chassis depending on the application. Working closely with National Instruments and Phase Matrix, BAE Systems has developed the next-generation RF SI based on PXI Express technology that meets the Synthetic Instrumentation design requirements defined by the Synthetic Instrument Working Group (SIWG) and its associated IEEE 1671.2 Annex TBD specification. In addition, to meet the eCASS interface requirements the SIU's software architecture incorporates the Interchangeable Virtual Instrument (IVI) standard and is PXIe Plug & Play compliant. This baseline configuration is modular and provides a small footprint required for the standard measurement functions, including an embedded controller (EC) allowing for stand-alone operation. For eCASS, the SIU's EC will be an external one rack unit (1 U) chassis allowing for removable Raid hard drives that can be easily removed to address requirements for executing classified data.

Some of the primary benefits of the SIU 100 of FIG. 1 include:

Emulation of legacy CASS instrumentation

Test flexibility to adapt to unknown and future test requirements

Reduction in the eCASS ATS size/footprint

Reduction of eCASS ATS hardware logistics and instrument calibration costs

Mitigation of eCASS obsolescence risk & promotes long service life

Ease of future eCASS upgrades

Reduction in eCASS self test/maintenance costs

Reduced/streamlined development time for the eCASS ATS

Reduced TPS run times by increased measurement speed/efficiency

Promotes ATS interoperability between eCASS configurations and reduces the training costs among users By virtue of its flexibility to synthesize measurement functions utilizing a minimal set of generic hardware and software components, the SIU 100 has the potential to replace several conventional test instruments (i.e., rack-and-stack test instruments) and reduce the overall eCASS size/footprint, hardware logistics (sparing) costs, and associated instrument and Automatic Test Systems (ATS) calibration costs.

Also, since it is composed of a minimal set of generic components, eCASS ATS obsolescence risk is substantially mitigated by having several sources for individual modules. eCASS upgrades are easily facilitated via software as opposed to a lengthy hardware acquisition process; non-recurring self-test costs and recurring maintenance costs for eCASS should also be lower due to the shear reduction of discrete instrumentation types to be supported vs. conventional rack-and-stack instrumentation architecture.

Using synthetic instrumentation reduces the eCASS test software development time and increases measurement speed and testing efficiency. This is substantiated by the primary premise/attribute of Synthetic Instrumentation. That is, the SIU 100 is primarily a signal-based measurement paradigm. For example, measurements utilizing Synthetic Instrumentation technology are predicated on digitizing a down-converted or base-band IF (relatively low frequency signal) signal and storing that information in a measurement map (Value (ordinate) vs. ATS state (abscissa)) or database. From that storage bin, multiple operations on the digitized data can be performed by applying various algorithms to affect one or more measurements. By virtue of being signal-based, measurements which use the same data set can be affected in a shorter period of time than classical measurements performed with traditional instrumentation which repetitively acquire, analyze and present results for each unique measurement (i.e., rise time, fall time, pulse width, frequency).

Finally, since the SIU 100 can be utilized as a common component to any DOD ATS system, the utilization of Synthetic Instrumentation promotes and fosters Test & Measurement (T&M) interoperability and potentially can reduce training costs among several end users. Since SI-based ATS capability is primarily software-based and not instrument-based, the same hardware asset employing a generic set of core components (up converters, down converters, ADCs, DACs) can be utilized to support a broad cross-section of Units Under Test (UUT). Each end user can tailor the SIU 100 per their unique requirements via UUT specific Interface devices/signal conditioning and application specific software employing either text or graphical-based programming.

The SIU 100 provides the opportunity to satisfy the eCASS application specific test requirements via test scripting of required functions of obsolete test equipment and the employment of Graphical User Interface (GUI) software available in LabVIEW. This eliminates the concept of paying for more T&M than you need; eCASS only pays for the hardware and software that it needs in support of eCASS test applications. Incremental/just in time test software functional capability can be added in the future predicated on real eCASS test requirements as opposed to the "perceived" testing requirements. The SIU 100 modularity allows the end user to upgrade the SIU 100 (for example, extend the frequency range or improve the accuracy of your test system because of advancing technology of your target UUTs). This pragmatic approach to eCASS testing is easily affected using modular technologies such as PXI and LXI SI systems where the incorporation of the best technologies from both of these mainstream T&M architectures can be integrated to affect small, high speed, and cost effective hybrid SI systems.

Digital processing of the digital data in the SIU can be Field Programmable Gate Array (FPGA) based. To meet the high performance requirements in both measurement accuracy and speed and be easily reconfigurable, the SIU 100 may require computationally intensive, high-speed signal processing that is a natural application for FPGA-based signal processing. These new FPGA-based architectures allow the capability for Synthetic Instrumentation to provide equal and/or better performance in both measurement accuracy and measurement speed compared to legacy measurement methods predicated on firmware.

In addition to faster signal processors (i.e., FPGAs) modules, the SIU 100 couples a broader range of measurement "software cores" and end user-friendly development tools for the FPGA module to form new Synthetic Instrument architectures. These new hardware and software architectures provide a generic, flexible methodology for end users to easily develop new measurement capabilities, allowing the ATE to adapt to unknown and new/emerging measurement requirements.

The SIU capability is modular and reconfigurable and provides a cost effective solution for a user's specific application, including enhancements through software.

The SIU 100 can feature a high-performance embedded controller (EC) 110 with removable hard drives 112. The EC 110 can be a 1 U rack-mounted EC with removable hard drives to support SIU operations in a classified environment. The standard 250+ GB removable SATA II (Serial Advanced Technology Attachment standard) hard drives are easily removable via the EC's front panel. In addition, the EC can feature an Intel Core 2 Quad processor (2.4 GHz quad core); up to 2 GB of dual-channel DDR2 RAM, dual onboard gigabit Ethernet port and high-speed USB serial ports that support real-time processing and control of the PXI Express Synthetic Instrument.

The EC 110 can be coupled with the main SIU PXI Express chassis via an MXI-Express bridge for remote communications and control of the PXI Express system. The modularity of the PXIe-based SIU and the open development environment of LabVIEW make it easy to integrate peripherals into the SIU allowing for easy future upgrades.

Figure 3:
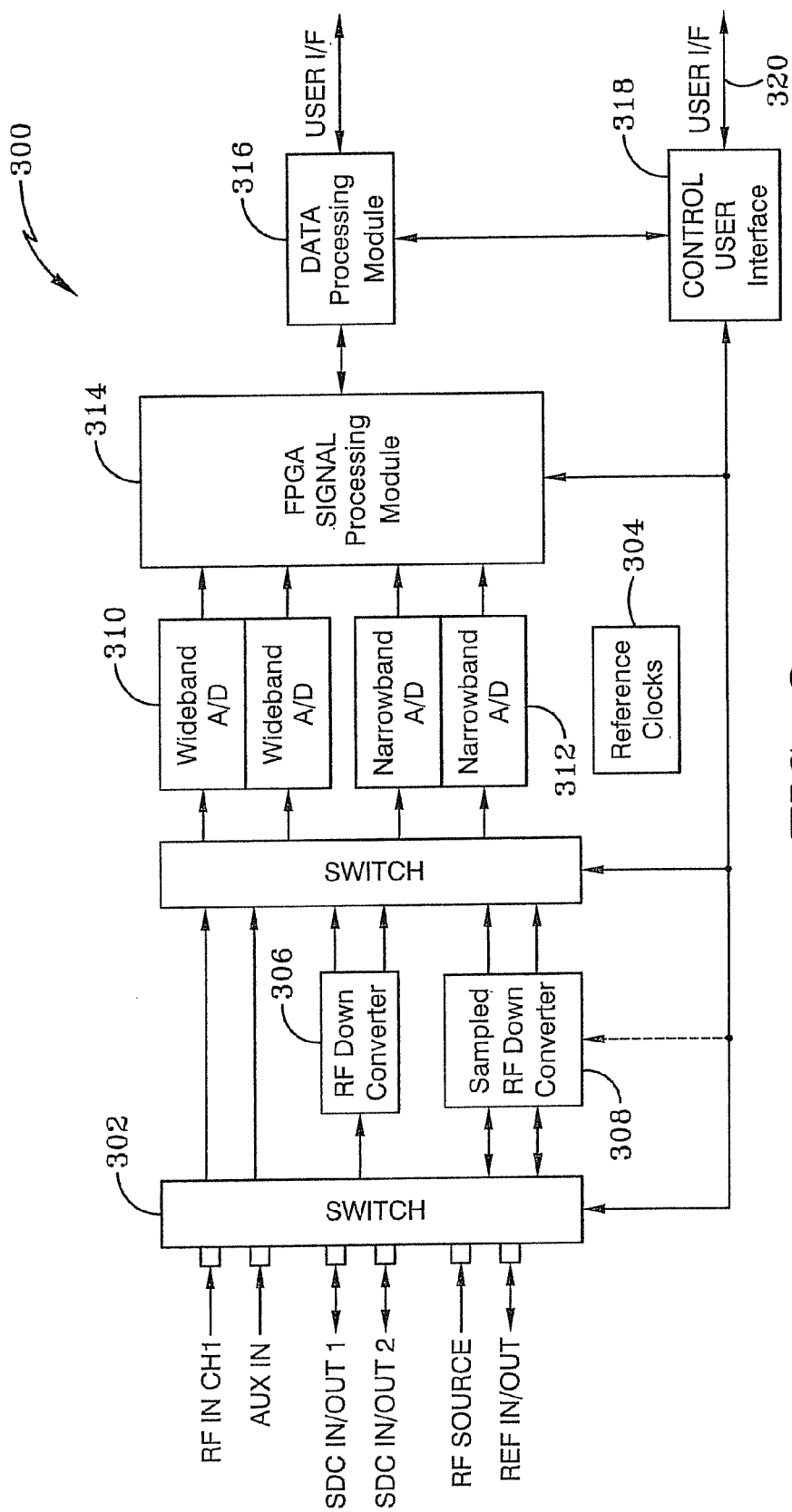
FIG. 3 is a schematic drawing illustrating the preferred embodiment of the synthetic instrument unit (SIU) in the eCASS RF MEK configuration.

FIG. 3 shows the functional block diagram of a proposed SIU 300 configured for the eCASS RF MEK (Mission Equipment Kits), which is a complete PXIe-based Synthetic Instrument measurement test system for low and high frequency applications capable of hosting several measurement personality modules. The SIU 300, consistent with the Synthetic Instrument modular architecture defined by the Synthetic Instrument Working Group (SIWG), provides the minimum set of hardware modules required for signal conditioning, down-converting, digitizing, storing, and processing signals using numerical techniques (i.e., digital signal processing or DSP) across a wide frequency range.

Still referring to FIG. 3, the input signal switch module is an application specific Input/Output (I/O) interface (I/F) module 302 that provides the necessary signal conditioning and signal path control to accommodate the various SI-based personality modules. This flexible I/O interface 302 can be easily modified to accommodate any uncertain or future test requirements with minimal impact to the SIU architecture. To meet the eCASS RF MEK requirements, the I/O interface has RF input ports that support generic RF Input signals from DC to 26.5 GHz. To support MTA measurements, the I/O interface has two RF I/O ports that emulate the RF ports on the obsolete MMS-based MTA and a RF source input port capable of accepting an external RF signal source for Vector Network Analysis (VNA) measurements. Finally, for improved performance the SIU hardware and processors can phase lock (and synchronize) to an internally generated 10 MHz reference signal from a clock generator 304 or to an externally supplied 10 MHz station reference signal.

Depending on the desired measurement function, the input signal is routed to the RF down converter 306 (generic RF measurements), the Sampled RF Down Converter 308 or SDC (for MTA or VNA measurements), or straight through to the IF Interface module. The down converted (or straight through) signals are output to the IF Interface module to be routed to either the dual channel wideband digitizer 310 or the dual channel narrowband digitizer 312. The digitized data is processed in the FPGA signal processing module 314 and the data/display processing module 316, and the results are displayed using the data/GUI display processing module 318 and/or transmitted to the end user via the remote control user interface 320.

SIU control is accomplished via the local GUI 318 or the remote user interface. For example, the station controller can control the SIU 300 via IVI-complaint commands over a standard LAN or USB 2.0 interface.

The SIU 300 can be configured into several measurement modes. The core SIU RF measurement system provides robust synthetic instrument measurement capability from DC MHz to 26.5 GHz, extendable to 220 GHz (via external mixers). For eCASS RF MEK, the SIU will be capable of synthesizing both the Spectrum Analyzer (SA) and the Microwave Transition Analyzer (MTA) functionality required for CASS TPS portability.

For TPS portability and future measurement requirements, the SIU 300 is capable of both SI-based spectrum analysis (i.e., Fast Fourier Transform or FFT-based spectrum analysis) and the classic spectrum analyzer swept frequency mode of operation. These two modes are user selectable via a software switch or a user-defined set of rules. The specific operational details are discussed later sections of this document. Emulating the required MTA functionality to meet the legacy TPS portability is achieved by incorporating a cost effective two-channel RF down converter module into the SIU 300 based on Sampled Down Converter (SDC) technology. Coupled with the other SI assets (i.e., waveform digitizers, signal/data processing modules), the SIU provides a MTA GUI-based Personality Module (PM) that facilitates the required MTA functionality (including vector-based measurements) that has been identified as part of the CASS MTA TPS usage analysis. In addition, due to the flexibility of the SIU FPGA-based measurement system architecture additional measurement functions associated with TPS portability that are identified during the SDD phase of the eCASS program can be added via software upgrades.

As indicated in the previous paragraph a cost effective SDC module can be added to the SIU hardware suite to meet the anticipated TPS portability requirement for CASS MTA usage. By utilizing an existing external signal generator asset within the eCASS RF sub-system as a RF source, SI-based Vector Network Analysis (VNA) measurement capability can be incorporated into the eCASS RF MEK configuration simply by adding a VNA personality module. The SI-based VNA will support measurements up to 26.5 GHz (dependent on the external RF Source). Specific details will be discussed in later.

By adding personality modules, the SIU 300 is capable of synthesizing both the phase noise analyzer and the noise figure meter. No modifications to the SIU hardware are required for phase noise analysis. However, a calibrated Noise Source is required for noise figure measurements which can be either integrated into the SIU Input/Output Interface (SIU I/F) module or provided as an external accessory. Specific details will be discussed in later.

Figure 4:
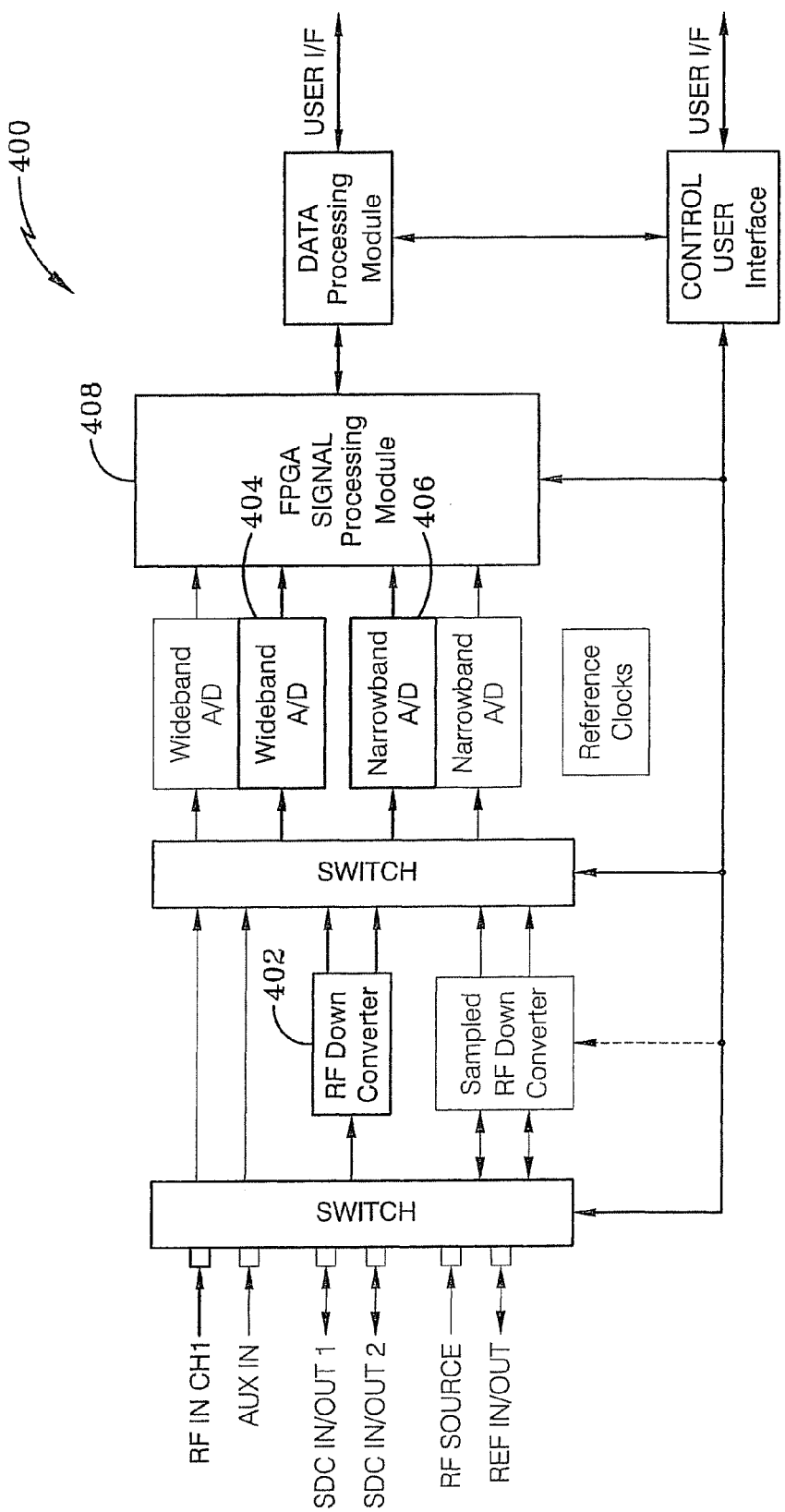
FIG. 4 is a schematic drawing showing the SIU graphical user interface of the SI-based spectrum analysis personality module according to one configuration of the preferred embodiment of the present invention.

To summarize, the SIU RF MEK configuration is capable of the following measurement modes:

Spectrum Analysis-FFT mode
Spectrum Analysis-Classic swept frequency mode
Two channel, high-speed 8-bit 1 GSPS waveform sampler
Two channel, high-dynamic range 16-bit 100 MSPS waveform sampler
Vector amplitude, phase, and power
CW and pulse carrier frequency CW and pulse power
Pulse width, rise and fall times
Vector and Scalar Network Analysis, including S-Parameters In addition, the SIU 300 is capable of providing Phase Noise Analysis and Noise Figure personality modules that meet the eCASS depot-level testing requirements:

FIG. 4 shows the SIU 400 configured for spectrum analysis. In this configuration, the SIU spectrum analysis personality module can generate spectral characteristics of input signal ranging from DC to 26.5 GHz and is extendable in frequency via the use of external mixers. The SI-based spectrum analyzer 400 can operate in two basic modes of operation: Standard FFT-based spectrum analysis and emulation of the legacy analog frequency swept mode. Modern signal analysis typically uses FFT-based methods. However, to ensure eCASS TPS portability it is necessary to emulate the functionality of the legacy analog spectrum analyzer technique. Both of these techniques are described in the ensuing paragraphs.

To understand the basic operation of the SI-based spectrum analyzer 400, refer again to FIG. 4. The input signals to the SIU are routed to the Phase Matrix (PMI) PXI-based RF down converter 402 which frequency translates the input signal to either a wideband or narrowband IF depending on the desired mode of operation (the wideband and narrowband IFs are 250 MHz and 25 MHz, respectively). The IF outputs are digitized by the wideband or narrowband waveform digitizers 404, 406 depending on the IF and routed to the FPGA signal processor 408 for spectrum processing. As a final step the resulting spectral data is delivered to the data and display processing module that displays the spectrum and generates the desired waveform characteristics.

Figure 5:
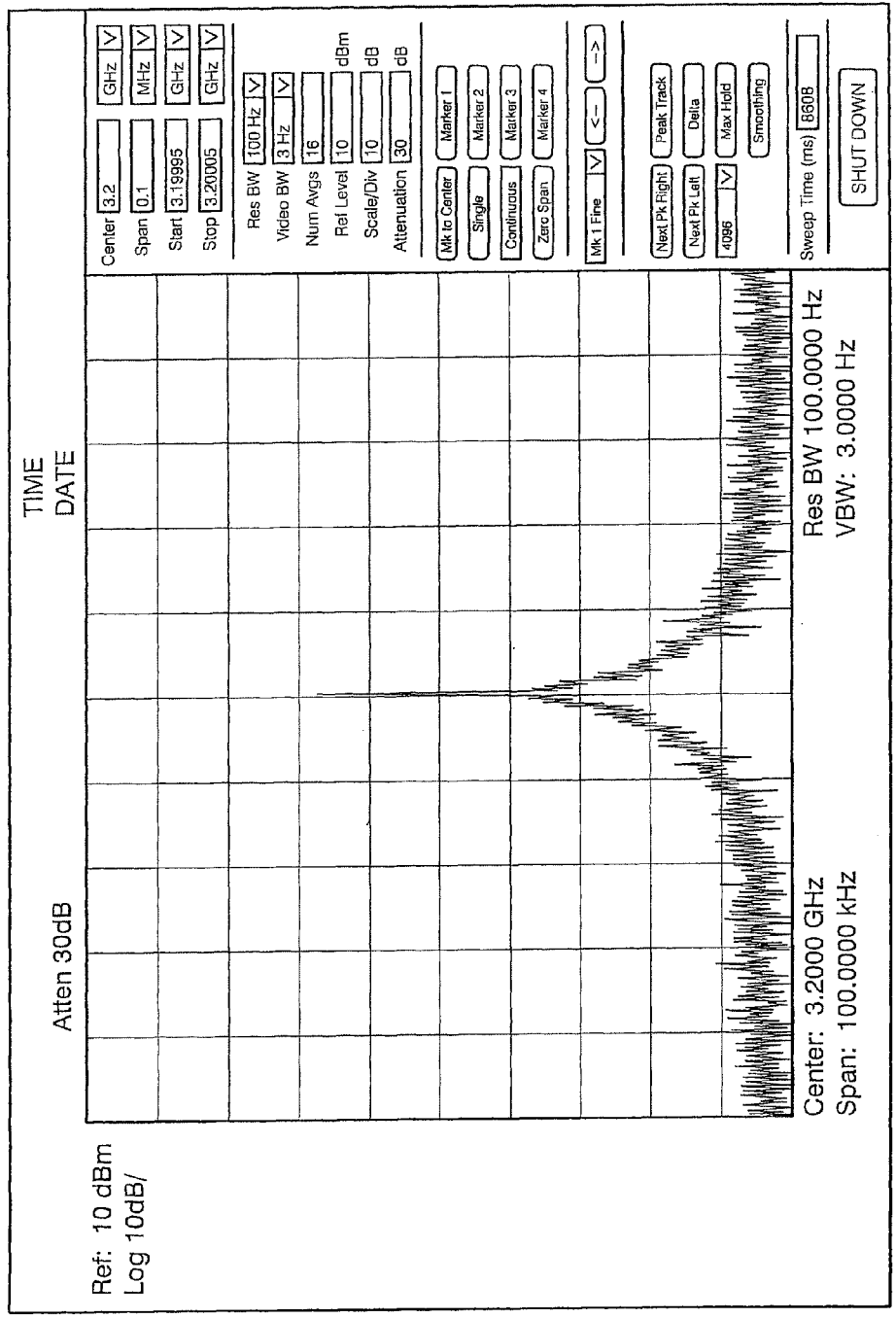
FIG. 5 is a graph which shows the SI-based spectrum analyzer local graphical user interface (GUI) and dynamic range performance of the SIU according to one configuration of the preferred embodiment of the present invention.

FIG. 5 illustrates an example SIU's spectrum analyzer Graphical User Interface (GUI) 500. The GUI 500 can be written in LabVIEW and may be hosted on the SIU's embedded controller and can provide user control of the spectrum analyzer measurement parameters (center frequency, span, resolution bandwidth, etc.), data/display processing and can provide synchronization of the SIU modules to synthesize the SI-based spectrum analyzer. As a complementing computational capability to the local GUI-based interface, the eCASS station controller can control the SIU via IVI-compliant spectrum analyzer class commands by communicating to the GUI via LAN and/or USB 2.0. This allows the SIU 400 to support stand alone operation and remote control. A user can input the standard spectrum analyzer parameters; center frequency, span, start and stop frequency, resolution bandwidth, video bandwidth or number of FFT averages, reference level, signal level display, etc. In addition, the user has access to the standard marker and spectral characteristics (marker peak, delta marker, etc.).

Table 1 provides the summary technical specification sheet for the SIU's Spectrum Analysis personality module.

TABLE 1

SIU Spectrum Analyzer Specifications

| Measurement | Range | Comments |
| --- | --- | --- |
| Frequency Range | DC to 26.5 GHz | Extendable via external mixers |
| Frequency Span Range | 100 kHz to 26. g GHz | |
| Resolution Bandwidth | 10 Hz to 3 MHz | |
| Resolution Bandwidth Resolution | 1, 3, 10 increments | Auto, User selectable |
| Video Bandwidth | 1 Hz to 3 MHz | |
| Video Bandwidth Resolution | 1, 3, 10 increments | Auto, User selectable |
| Sweep Time | 10 msec to 1000 sec | |
| Sweep Time Resolution | | |
| Trigger | Internal, External | User Selectable |
| Input Range | −150 dBm to +30 dBm | |
| Noise Floor | | |
| (100 Ha to 8.5 GHz) | −145 dBm | |
| (8.5 GHz to 26.5 GHz) | −135 dBm | |

Figure 6:
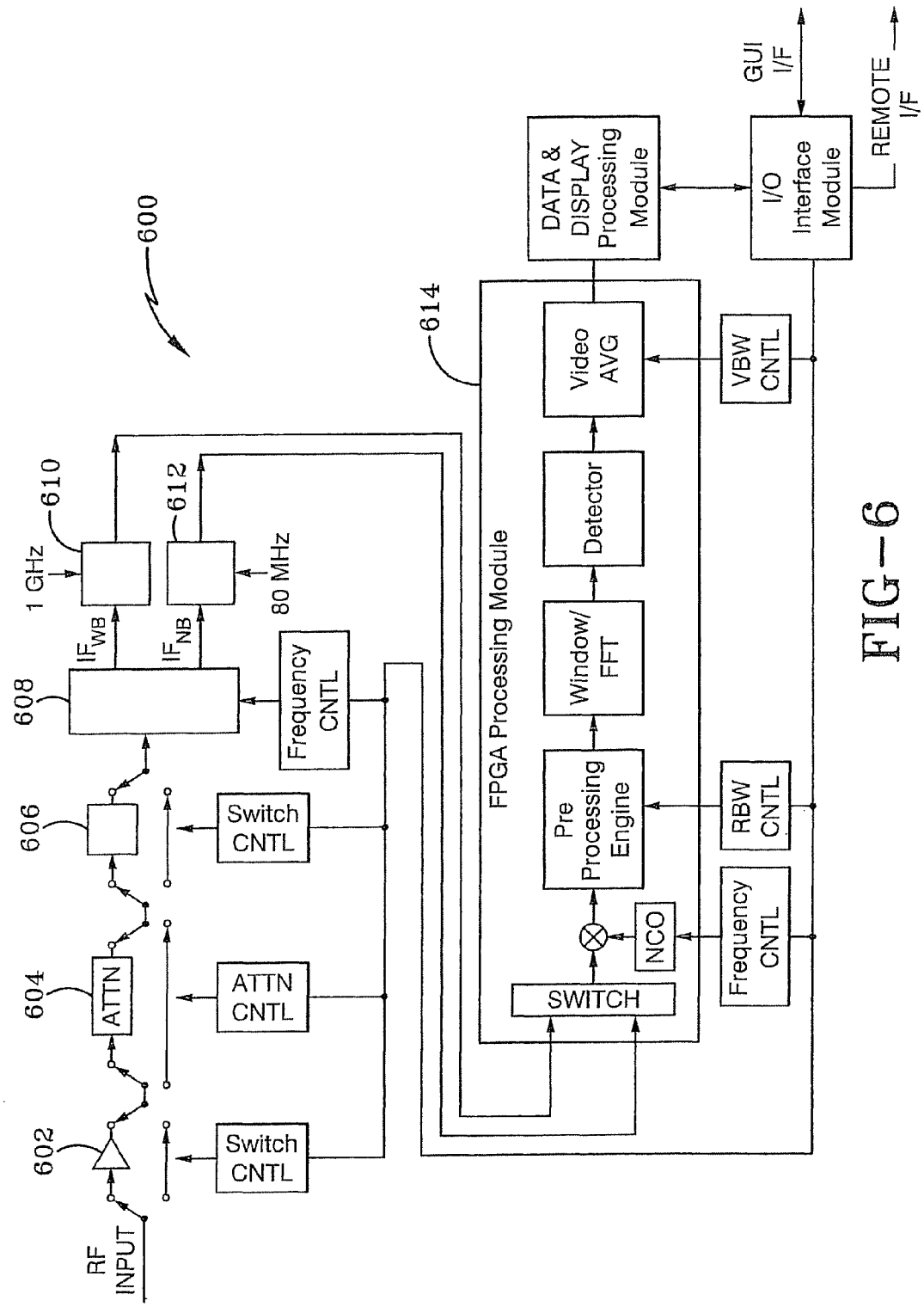
FIG. 6 is a SI-based spectrum analysis-FFT mode functional block diagram according to one configuration of the preferred embodiment of the present invention.

FIG. 6 shows the functional block diagram of the SI-based spectrum analyzer 600 configured for standard FFT-based processing. As shown in the figure, the input signal conditioning emulates the typical RF front end of high-performance spectrum analyzers. A Low Noise Amplifier (LNA) 602 can be switched into the signal path to provide a low DANL (Displayed Average Noise Level), an adjustable attenuator 604 can adjust the attenuation (0-70 dB) to accommodate large amplitude input signals, and a selectable and tunable YIG-based pre-selector filter 606 can eliminate alias signals, control bandwidth and suppress spurious signals. After signal conditioning, the input signal is down converted by the PMI RF down converter 608 and digitized by a wideband 610 or narrowband digitizer 612 depending on the desired resolution bandwidth and routed to the signal processing module 614. In the FPGA processing module 614 the sampled signal is filtered and standard FFT processing is performed, averaged and transmitted to the SIU's embedded controller for display and data processing.

Figure 7:
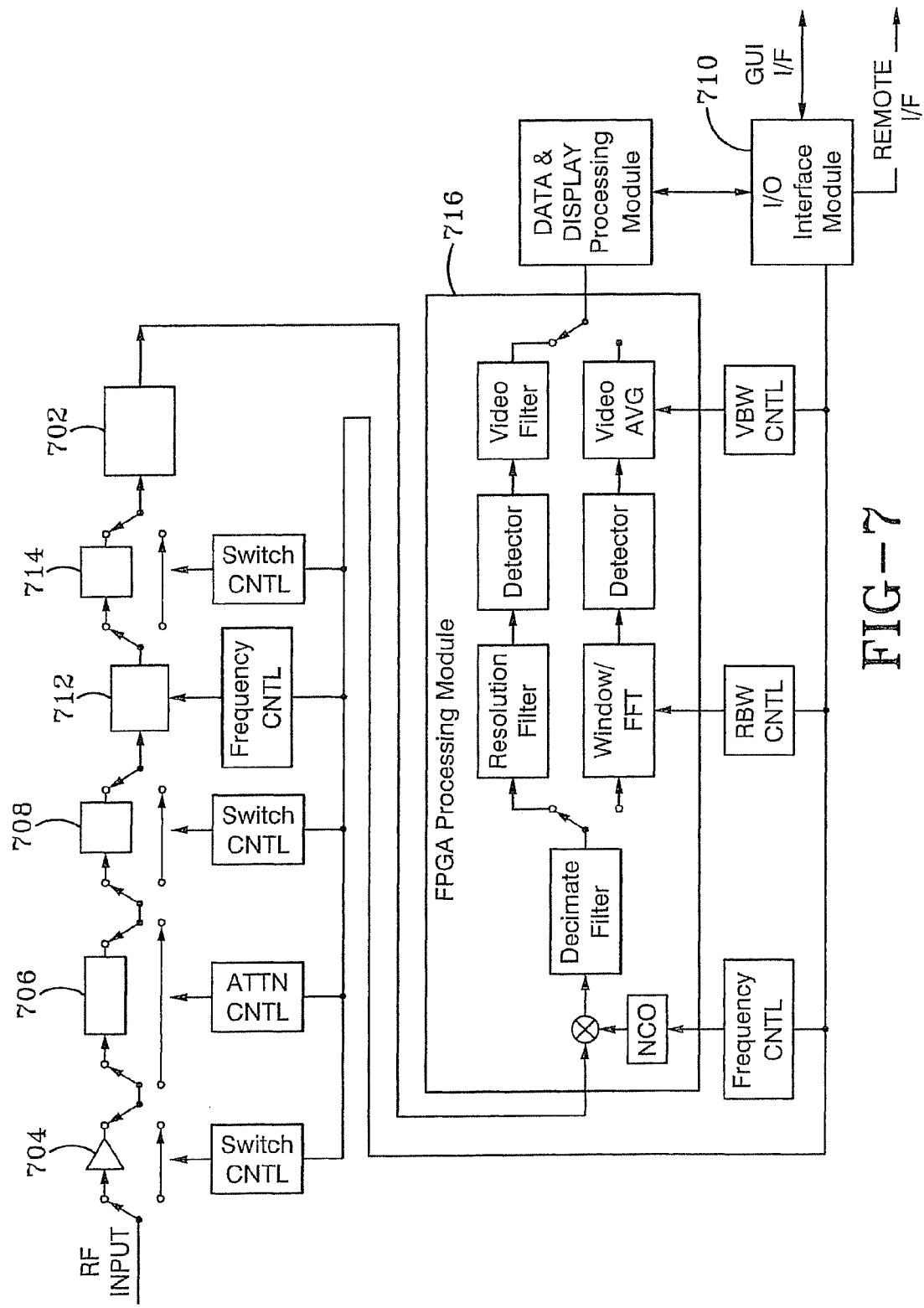
FIG. 7 is an SI-based spectrum analysis-swept frequency mode to emulate the classic analog spectrum analyzers according to one configuration of the preferred embodiment of the present invention.

As shown in FIG. 7, the SIU 700 can be placed in a SI-based spectrum analysis swept frequency mode. Traditional spectrum analysis is typically based on FFT processing techniques which are considered to be a non-real time process that processes a portion of the input signal of interest. For most applications this is the optimum spectrum analysis technique. However, to support legacy TPS portability a small set of input signals will require real-time processing (i.e., all input data is processed during the processing time) in order to obtain the desired signal characteristics and established metrics measured as part of the legacy TPS. To support real-time spectrum analysis the SIU 700 is capable of synthesizing the classic swept-frequency mode without additional hardware added to the baseline SIU hardware suite. The SIU 700 takes advantage of the high data throughput capability (250 MB/s) of the PXI Express bus and is capable of processing the output of the A/D Converter 702 without loss of data during the processing cycle.

FIG. 7 depicts the BAE System's technical approach to implementing the SIU spectrum analysis swept frequency mode of operation. A user selects the frequency swept mode via a user-selectable switch (software switch) and selects the desired spectrum analyzer parameters (center frequency, frequency span, reference level, etc.). Upon execution, the SIU 700 will configure the SI modules to the appropriate operating parameters and begin the required signal processing.

The input data is presented to the standard attenuation block 704, low noise amplifier 706, and tunable pre-selector filter 708 consistent with the FFT-based spectrum analysis method. These signal conditioning blocks 704, 706, 608 are switchable under control of the I/O interface and control module 710. The tunable pre-selector filter 708 can be tuned to a desired center frequency and exhibits 40 MHz nominal bandwidth. For most applications the pre-selector is switched into the signal path. However, for some applications (i.e., simultaneous broadband frequency span and fast sweep times) the pre-selector 708 is bypassed to eliminate the 1 msec propagation delay caused by the YIG pre-selector 708.

The conditioned RF input signal is block down-converted in the SIU's fast switching Phase Matrix RF down-converter 712 to a 30 MHz IF. The switching speed of the RF down converter 712 assuming small frequency steps (relative to the center frequency) and small frequency error (+4.5 percent of final center frequency) is on the order of 10 μsec. With the Phase Matrix IF output blanking disabled, the IF output is filtered with a bandpass filter 714 centered at 25 MHz with a 30 MHz 3 dB bandwidth. The filtered IF output is digitized by the narrowband A/D module 702 and streamed in real-time to the FPGA signal processing module 716 via the PXI Express bus. In the FPGA 716 module the input signal is down converted to baseband, filtered, and decimated to the appropriate sample rate determined by the desired resolution bandwidth.

In the FPGA signal processing module 716 two processes are available depending on the spectrum analysis parameters selected by the end user. For normal operating conditions the YIG pre-selector 708 is included in the RF signal path and standard real-time FFT processing is performed on the streaming data: a FFT is performed on the windowed decimation filter output, detection, and FFT averaging with the output passed directly to the data/display processing module for real-time display. The FFT size is small compared to the standard block processing to allow for real-time processing of the data. During the 10 msec switching period of the Phase Matrix RF down converter 712 the streaming data is ignored to ensure that the frequency error is within the +4.5 percent of the center frequency of the RF down converter 712.

After processing, the data the digital down conversion processing module 712 is incremented and the spectrum analysis processing is repeated until processing of the entire 30 MHz bandwidth is completed. After completion of the real-time signal processing, of the 30 MHz portion of the frequency span, the center frequency of the YIG pre-selector 708 (if applicable), the RF down converter 712 center frequency is incremented and the process repeated until the full RF span is completed. The SIU 700 is reset to the initial conditions and the entire process is repeated resulting in synthesizing the classic spectrum analyzer frequency sweep mode.

For very fast switching times (for example, 10 msec), the YIG pre-selector filter 708 is bypassed and the standard digital filtering, detection and video filtering is selected to minimize the processing latency and computational resources. In this mode, however, the 10 msec switching period of the phase matrix RF down converter 712 the streaming data is processed and the dynamic range and accuracy may be compromised which is consistent with the legacy spectrum analyzers performance when set up with similar operating conditions. However, since digital signal processing is employed the accuracy of the digital filtering exceeds the legacy analog filtering in classic spectrum analyzers because of the tight control over the digital filter parameters. Specifically, the filter precision of the filter parameters (bandwidth and gain) is repeatable to within the numerical precision of the process.

FIG. 8 illustrates the SIU 800 configured as a microwave transition analyzer (MTA) based on synthetic instrument technology. This IVI-compliant MTA 800 based on synthetic instrument technology is proposed capable of synthesizing the set of the MMS-based MTA functions required to meet TPS portability. In addition, due to the enhanced performance of the SIU 800, the SI-MTA architecture is capable of emulating the MMS-based MTA functionality currently employed in CASS with better performance metrics. Since no MTA-specific IVI class exists, the SI-MTA 800 will be IVI compliant based on the generic class structure. Additional IVI commands required to support MTA portability discovered as part of the eCASS development can be easily added.

One challenge is to provide a cost effective solution to the CASS TPS portability requirement for TPSs that utilized the obsolete MMS-based Microwave Transition Analyzer (MTA). To accomplish TPS portability the set of MTA functions identified as part of the MTA usage investigation with a SI-based MTA solution can be duplicated.

Another challenge facing SI-MTA emulation is the vector measurements of the legacy MTA, including the vector ratio (and derivative measurements) and network analysis. The legacy MTA used a 10-20 MHz input sampling system because no high speed, high bandwidth Analog-to-Digital Converters (ADCs) existed and sampled mixers (i.e., RF samplers) were used to down sample (i.e., alias) the RF input to a frequency range compatible with the current ADC technology. The Local Oscillator (LO) was adjusted manually or by continuous sweep to frequency translate the RF input to the IF, and the trick was to set the LO to the correct frequency for the RF input signal to be mapped to the suitable output frequency.

The dynamic range of the legacy MTA for high frequency input signals was degraded because the RF sampler had limited harmonic bandwidth and exhibited poor performance for high input frequencies. This limited performance is because it is difficult to get harmonics from a 10-20 MHz pulse that has much energy at 10 GHz. However, the legacy MTA sampler had the advantage in that it provided a strong, simple, low frequency output capable of operating down to DC. Even modern digital storage oscilloscopes (DSOs) use this type of sampler except that they use higher fundamental LO frequencies and only support a few GHz of input bandwidth.

FIG. 8 shows the functional block diagram for the SIU 800 configured for SI-MTA measurements, which utilizes the power of the synthetic instrument for making frequency, time-domain and network analysis measurements. For measuring frequency, harmonic analysis and power measurements the SI-MTA 800 leverages the SI-based spectrum analysis personality module modified for MTA specific measurements. For time-domain measurements the SI-MTA 800 leverages the Phase Matrix RF down converter and the SI's 800 high-speed waveform digitizers coupled with powerful digital signal processing (DSP) software. For measuring vector-based signals the SI-MTA 800 uses the SDC, waveform digitizers 802 and DSP software to generate vector ratio, phase difference, and vector power. And finally, the SDC module 802, waveform digitizer and DSP software coupled with an external RF source allows for forward transmission and reflection, coupled with an external RF source. These modes will be discussed in more detail later.

Two MTA compatible input/output (I/O) ports are provided at the SIU Interface (I/F) module 802 that supports the required frequency range of DC to 26.5 GHz. The input signals are routed via an internal input switching module 806 to the SIU's RF down converter 804, or to the SDC 808, or directly to the output switching module 810 depending on the desired measurement. Control of the SI-MTA 800 is accomplished via the SIU's embedded controller 825 or the eCASS station controller.

The SI-MTA can integrate a dual-channel RF down converter module into the baseline SIU hardware suite based on sampled mixers providing the capability of vector amplitude and phase measurements. This is similar to the legacy MTA architecture except that higher performance samplers and low frequency measurements are accomplished using separate hardware. Coupled with the other SI modules, the SIU can generate vector amplitude, phase difference and vector power (peak and average) measurements. This "vector" down converter 900 (i.e., Sampled Down Converter or SDC) is shown in FIG. 9 and is a 1 U 19 inch rack-mounted module that is easily integrated into the SIU 800.

The SI-MTA 800 improves vector measurement performance compared to the legacy MTAs. The high frequency performance of present state-of-the-art (SOA) sampling mixers is better due better design techniques and to the lower order of harmonics required because of the increased sampling rates of current ADC. However, better dynamic range at higher frequencies is achieved at the expense of performance at low frequencies because the sampled mixer dynamic range performance is dependent on the ratio of the largest-to-smallest frequency covered. This is the primary reason that the legacy MTA makes a poor Vector Network Analyzer (VNA). Therefore, to extend the frequency range of the SDC down to DC, a direct mixer module is added to cover the lower frequency range.

Figure 10:
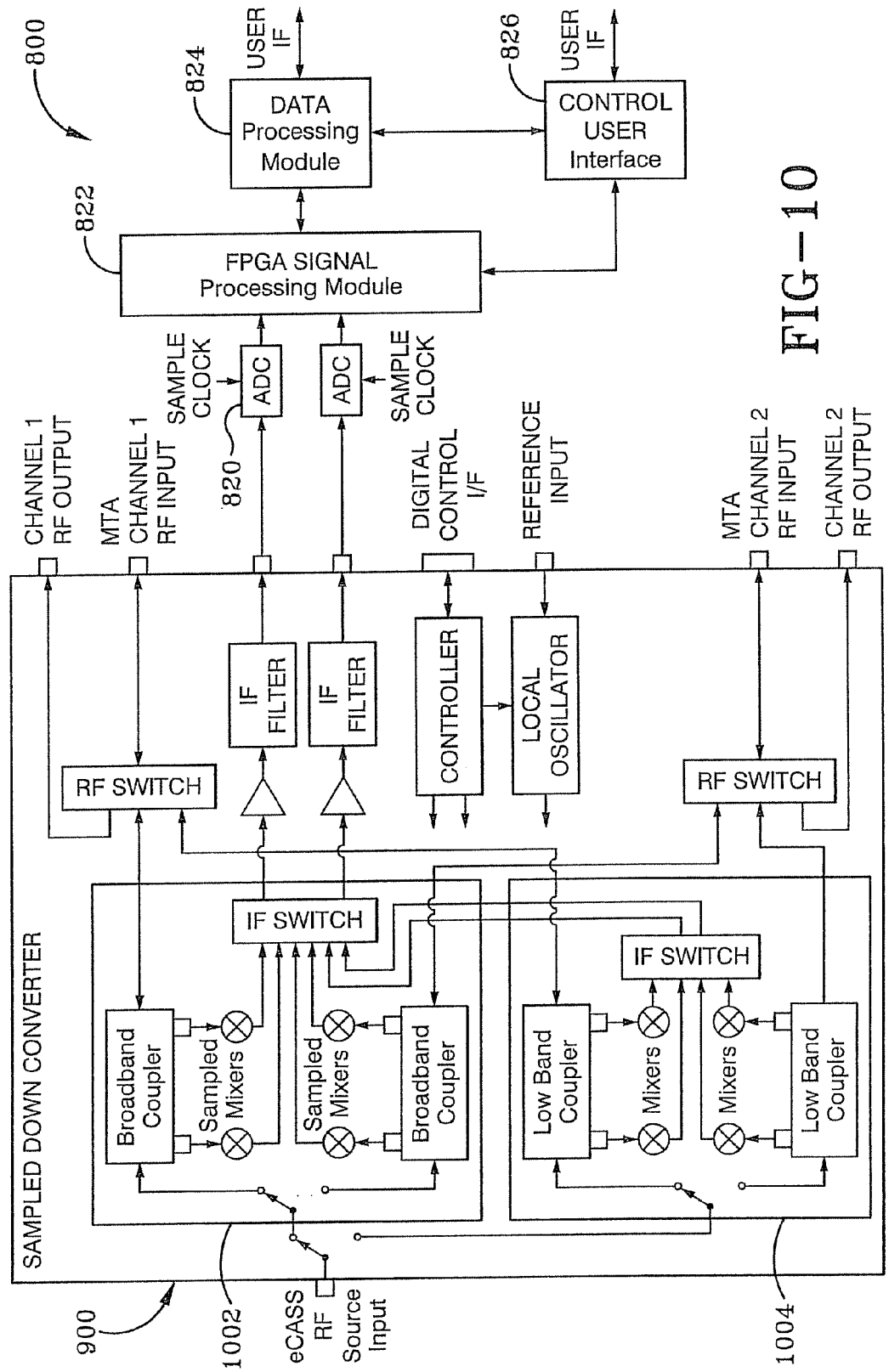
FIG. 10 is an SI-MTA sampled down converter (SDC) functional block diagram according to one configuration of the preferred embodiment of the present invention.

To understand the operation and performance of the SI-MTA for vector measurements, refer to FIG. 10 which depicts the functional block diagram of the SDC 900 connected to the SI-MTA 800. To accommodate the DC to 26.5 GHz frequency range, low-band and high-band RF-to-IF converter modules 1002, 1004 are included in the SDC 900. An input signal is connected to MTA Channel 1 and/or MTA Channel 2. Depending on the measurement the input signal is routed to either the low-band module, high-band module, or directly back to the MTA RF output ports. For low frequency operation, the input signals are down converted to the IF using fundamental mixing, passed to the IF module for filtering and amplitude control and routed to the IF output ports. For high frequency operation the MTA input signals are routed to the high-band module and down converted to the IF using the sampled mixers, passed to the IF module for filtering and amplitude control and routed to the IF output ports. The IF outputs are then digitized by the SIU's 800 two-channel narrowband ADCs 820 and then processed by the FPGA 822 and data/display processors 824, 826. In addition, for DC and very low frequency operation the MTA input signals are routed directly to the waveform digitizers and processed by the FPGA 822 signal and data/display processing modules.

As shown in FIG. 10, the low-band and high-band modules include internal couplers that allow the SI-MTA to generate the VNA measurements including forward transmission and forward reflection required for CASS TPS portability (coupled with an external RF source). Performance is improved because the SI-based VNA is capable of S-Parameter measurements and leverages the performance improvement of 12-term VNA error correction. In addition, incorporating the RF couplers into the SDC module 900 eliminates the need for the external couplers presently required for the legacy MTA. With this approach, testing the integrity of RF inter-connect cables and passive components is simple and fast and does not require any ancillary hardware other than a VNA calibration kit (calibrated open, short, load).

Figure 11:
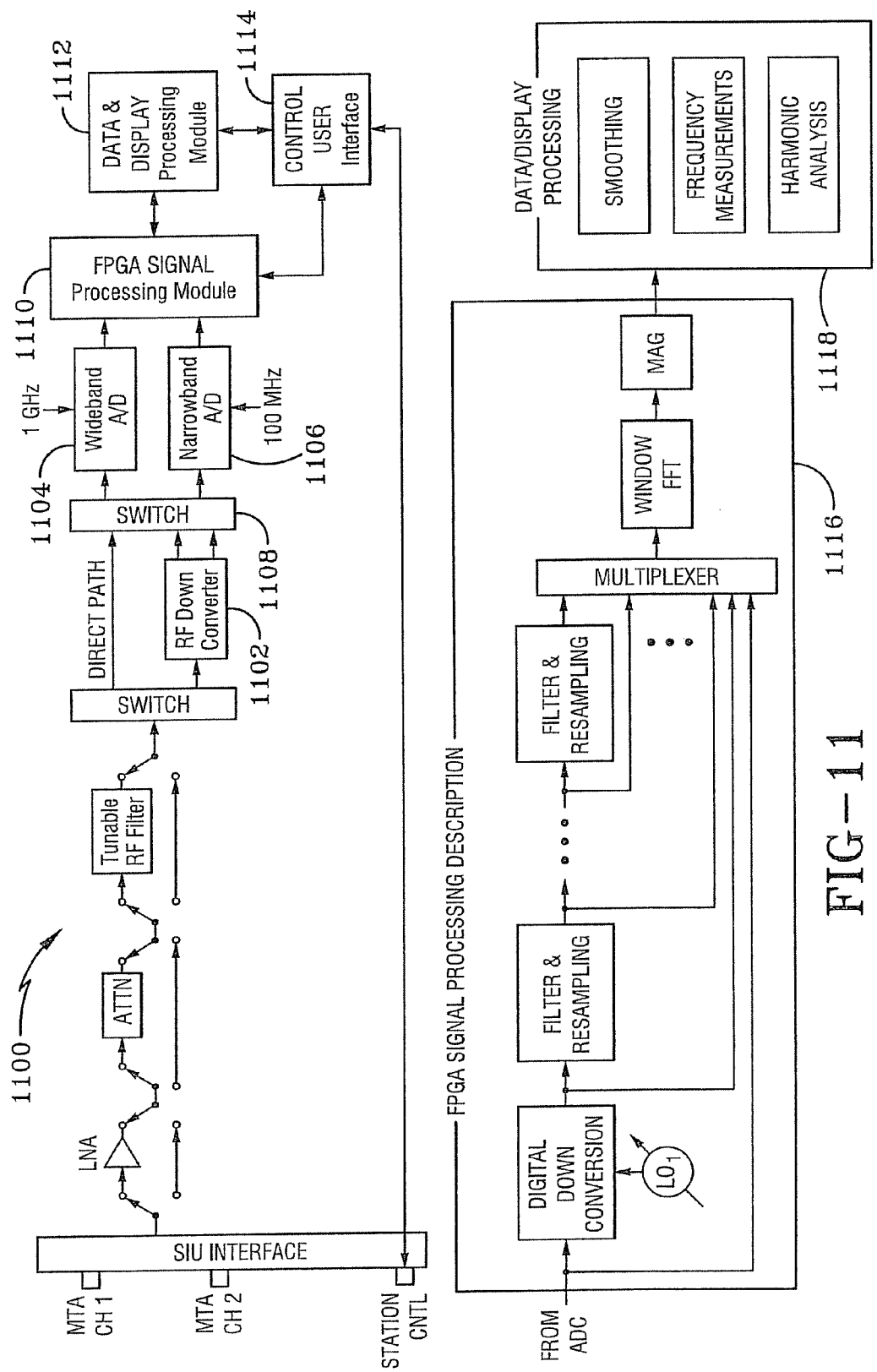
FIG. 11 is a schematic drawing showing the SIU configured for frequency and harmonic analysis according to the preferred embodiment of the present invention.

CW and Pulse frequency and harmonic analysis is provided by modifying the exiting SIU's spectrum analysis personality module to emulate the functionality and interface of the legacy MTA. The SI-MTA can support the frequency range from DC to 26.5 GHz for frequency and harmonic analysis. FIG. 11 shows the functional block diagram of the SIU 1100 configured for SI-MTA measurements.

An input signal can be connected to either MTA Port 1 or MTA Port 2 at the SIU's RF Interface module and selected via the SI-MTA graphical user interface (GUI) or from the IVI-compliant remote interface. The SI-MTA leverages the existing high-performance SI-based spectrum analyzer including the RF front end. Therefore, the SI-MTA can take advantage of the SIU's calibration and alignment, and existing signal conditioning to improve the MTA measurement, including low noise performance (LNA), increased dynamic range (both LNA and variable gain), and bandwidth control via the RF pre-selector filter. As shown in the FIG. 11, the signal conditioning output is routed to the Phase Matrix RF down converter 1102 or directly to the waveform digitizers 1104, 1106 via RF switching 1108 depending on the input frequency. The RF down converter 1102 provides a narrowband and wideband IF output that is routed to the waveform digitizers 1104, 1106 which samples the IF waveform at either 100 MHz or 1 GHz depending on the bandwidth of the IF waveform. The digitized waveform is then routed to the Signal/Data/Display processing modules 1110, 1112, 1114 for frequency and harmonic analysis.

Due to advances in RF, ADC and signal processing technology, it is not necessary to duplicate the legacy MTA design for measuring frequency, but only duplicate the legacy MTA interface, functionality and results. FIG. 11 shows the signal processing implemented by the SI-MTA 1100 to measure frequency for both CW and Pulse input signals. The FPGA signal processor 1116 features a pre-processing module that allows for conditioning of the input signal to improve the frequency measurement. The ADC output is frequency translated to baseband, converted to complex data and filtered using state-of-the-art multi-rate filtering techniques. The objective of the filtering is to reduce the noise bandwidth to maximize signal-to-noise ratio (SNR) of the signal prior to the frequency measurement and to increase measurement speed by minimize the computational resources required after the filtering process. This approach is similar to the analog IF filtering performed in the legacy MTA for noise reduction except that the SI-MTA 1100 not only performs IF filter prior to the ADC but improves the SNR by precise digital filtering in the FPGA signal processing module resulting in optimum SNR for that specific measurement.

After pre-processing the input waveform the CW/Pulse spectrum (i.e., frequency) is determined using the standard window/FFT technique in the high-speed FPGA processing module 1116. The FFT output is converted to magnitude (i.e., detector) and then passed to the data/display processing module 1118 that evaluates the FFT output to determine the frequency content of the input waveform. The user can select smoothing to improve the measurements.

Harmonic analysis is performed using a similar method described above. The fundamental frequency of the input waveform is measured. The SI-based spectrum analysis parameters are configured to sweep across a wide frequency on either side of the fundamental frequency in narrow frequency increments and the results passed to the data/display processing module. In the data processing module the harmonics are measured (frequency and power levels), verified and stored in memory, and passed to the station controller.

The SI-MTA supports the legacy MTA frequency sample mode. The spectrum analysis results can be stored in memory and the results passed to the eCASS controller. However, the flexibility of the SI solution also allows the end user to display the data using the local GUI and provide the ability for the end user to develop additional processing in the SIU embedded controller.

Figure 12:
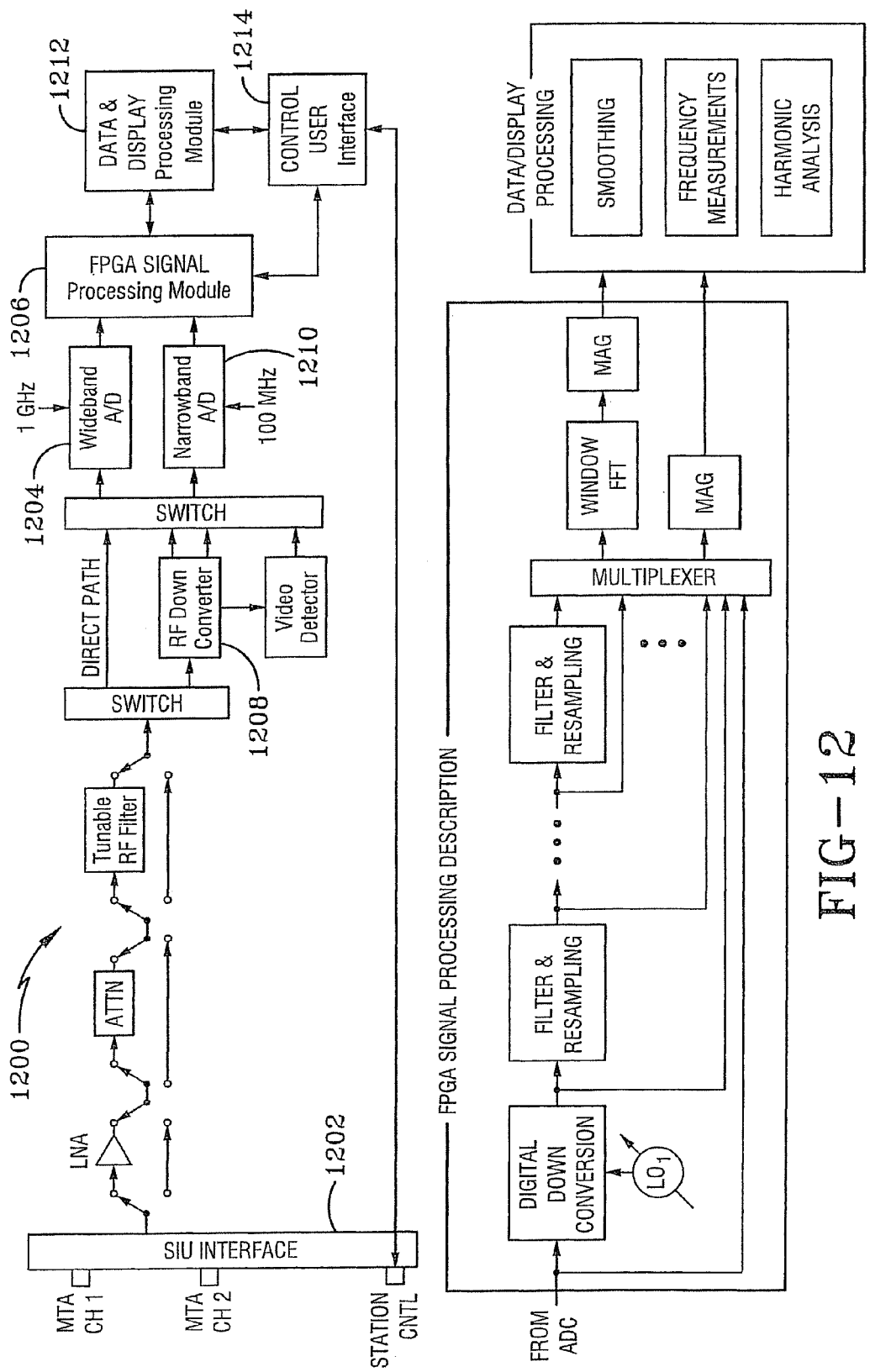
FIG. 12 is a schematic drawing showing the SIU configured for average and peak power measurements according to the preferred embodiment of the present invention.

FIG. 12 shows the SIU functional block diagram and signal processing description with the SIU 1200 configured for performing SI-based average and peak power measurements for CW and Pulse signals. The input signal is connected to either MTA Channel 1 or MTA Channel 2 at the SIU Interface module 1202.

For power measurements and flexibility several options are available to the user. The input signal to the SI-MTA can be routed back to the MTA output interface port via software control providing the option to use the existing power meter installed in the RF MEK station. However, the SI-MTA is also capable of measuring average and peak power or both CW and Pulse signals with the SI-MTA. Referring again to FIG. 12, the reader can see that the SI-MTA 1200 also takes advantage of the available signal conditioning to improve the power measurement. The input signal is passed to the RF down converter 1208 or directly to the waveform digitizers 1204, 1210 depending on the input frequency and the pulse characteristics. The digitized signal is filtered and is routed either to the FFT block 1206 or directly converted to magnitude. The detected output is passed to the data/display processing module that calculates the peak or average power within the bandwidth determined by the pre-processing filtering and/or the FFT block. The results are transmitted to the station controller.

As stated earlier, the challenge facing the SI-MTA 1200 is duplicating the vector measurements of the legacy MTA which is accomplished by integrating the dual channel SDC module 900 of FIG. 9 into the baseline SIU hardware suite. Coupled with the other SI modules (waveform digitizers 1204, 1208, FPGA 1206 and data/display processing modules 1212, 1214), the SIU 1200 can generate vector amplitude, phase difference and vector power (peak and average) measurements required for TPS portability.

Figure 15:
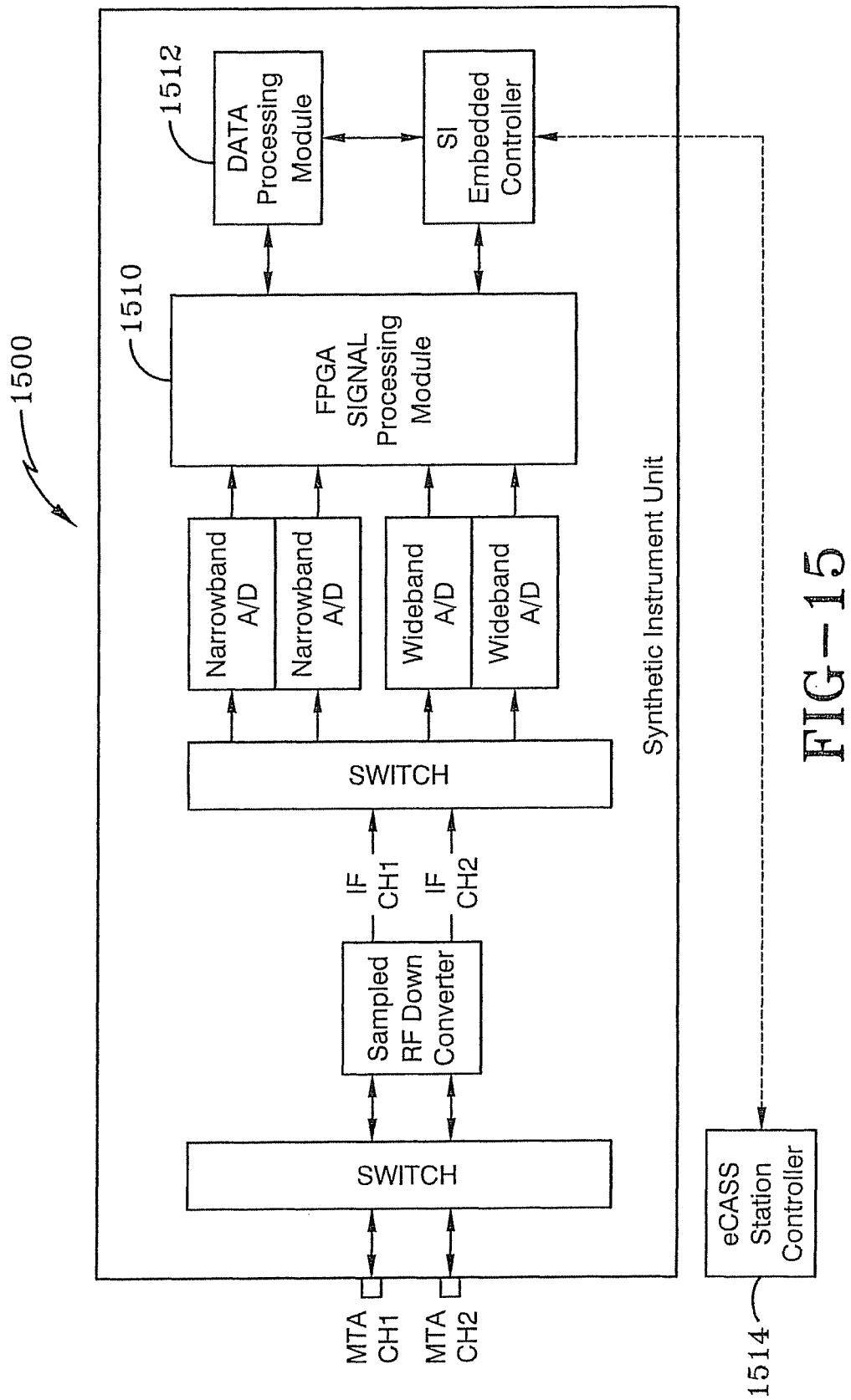
FIG. 15 illustrates a schematic showing the SIU configured for vector measurements according to the preferred embodiment of the present invention.

FIG. 15 illustrates a schematic showing the SIU configured for vector measurements. Two input signals are connected to MTA CH 1 and MTA CH 2. The dual channel SDC 1200 of FIG. 12 synchronously down converts the two input signals to an IF frequency that are digitized by the wideband waveform digitizers sampling at 1 GHz, and passed to the FPGA signal processing module 1510. Voltage ratio, phase difference between CH1 and CH2, and vector power can easily be calculated, displayed on the local MTA GUI and/or the results passed to the eCASS station controller 1514. Sampling the IF waveforms at 1 GHz results in a real-time sample resolution of 1 nsec. However, additional resolution is achieved in the FPGA processor 1510 by interpolation.

Figure 14:
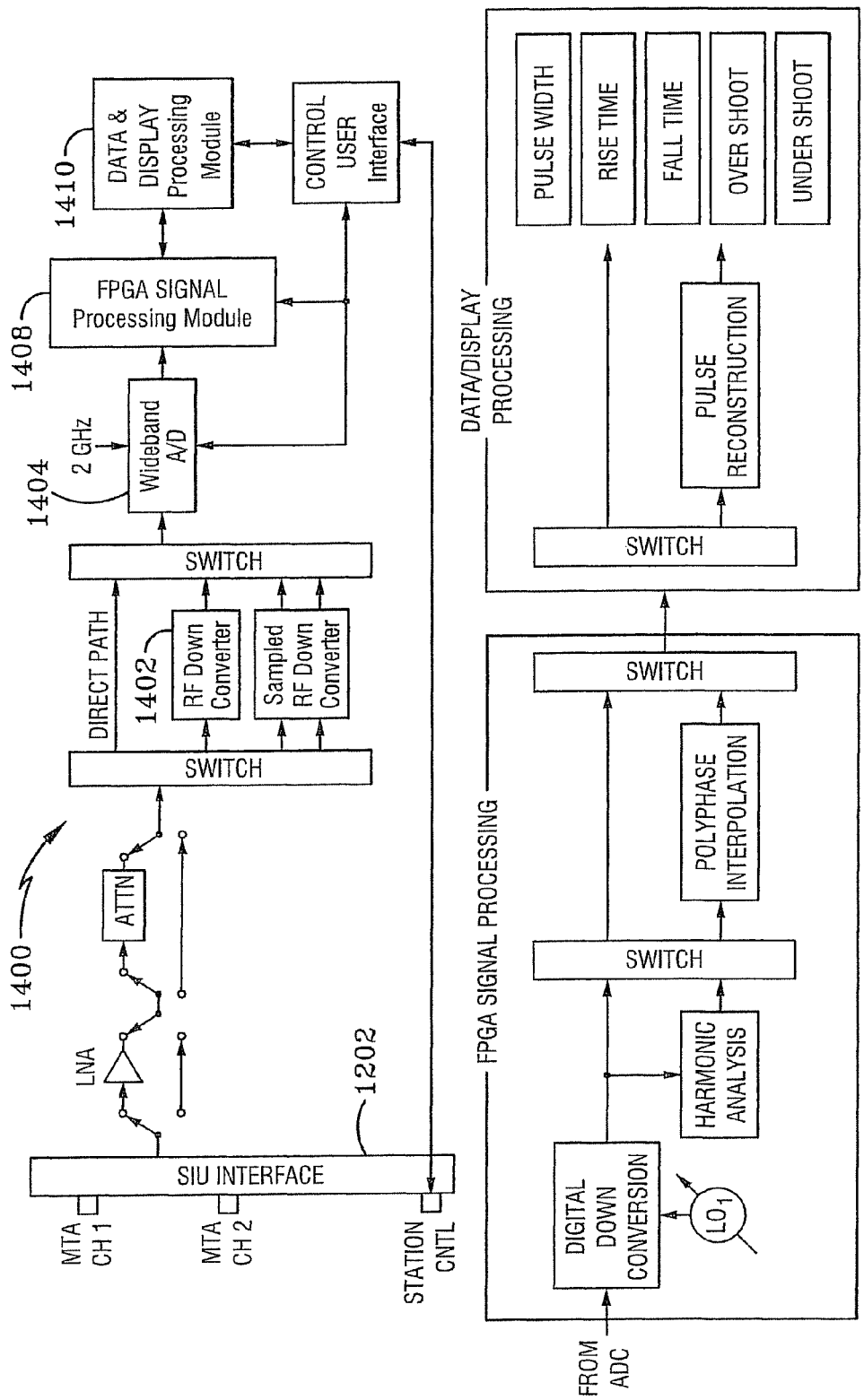
FIG. 14 is a schematic drawing showing the SIU configured for time-domain measurements according to the preferred embodiment of the present invention.

Coupled with the SDC, advances in analog-to-digital converter (ADC) and Digital Signal Processing (DSP) technologies, the SI-MTA 1400 can measure the time-domain characteristics of wideband signals including pulse width, rise time, and fall time. FIG. 14 shows the SIU 1400 configured for time-domain measurements. The time domain characteristics of the input signal can be accomplished using several methods depending on the characteristics of the input signal.

As shown in the FIG. 14, the input signal can be down converted to 250 MHz (350 MHz bandwidth) using the Phase Matrix RF down converter 1402 and digitized using the wideband digitizer 1404, routed directly to the wideband digitizer 1404 for input signals having an analog bandwidth of 1 GHz, or sampled using SDC harmonic analysis and reconstructed using DSP techniques.

For non-repetitive time-domain waveforms with bandwidths less than 400 MHz the equivalent sample resolution of the wideband 8-bit waveform digitizer can be improved by combining the two 8-bit ADC channels to form an equivalent 2 GHz real-time sampling rate.

Figure 13:
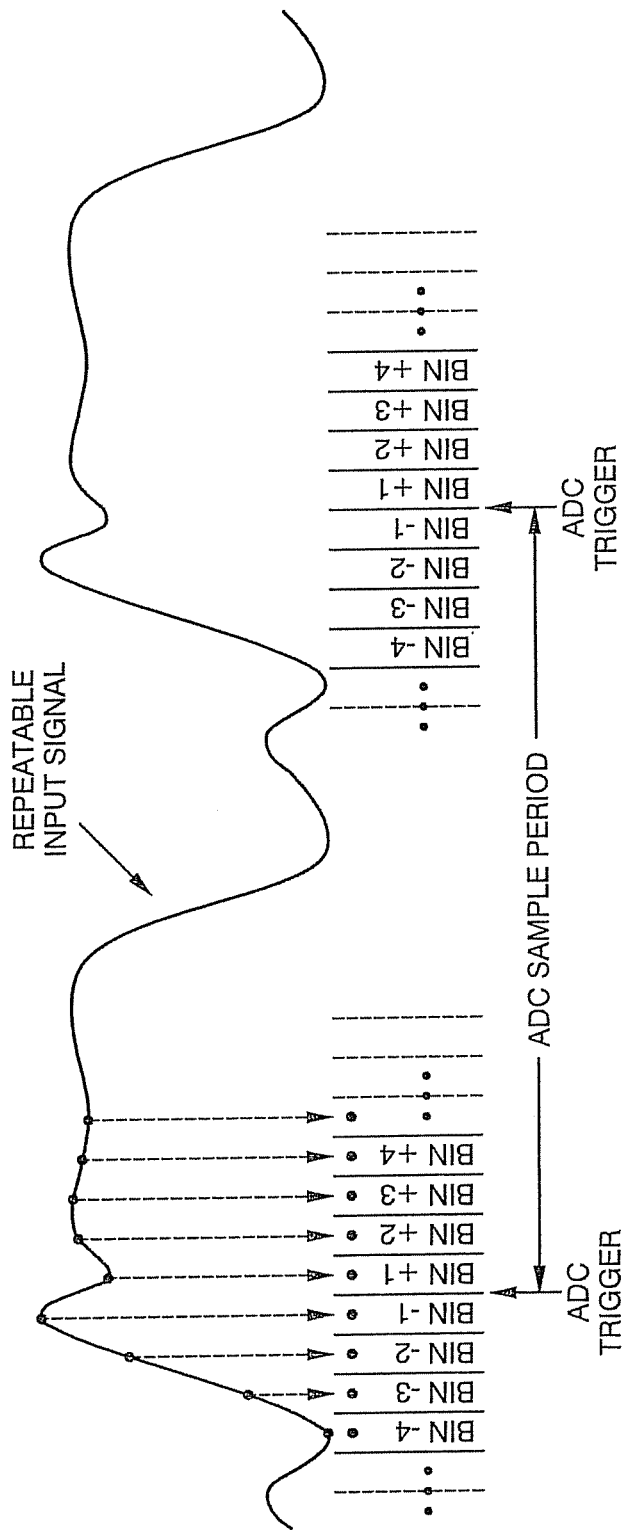
FIG. 13 is graph showing an equivalent sampling for achieving high sample rates for repeatable input signals according to one configuration of the preferred embodiment of the present invention.

For repetitive time-domain waveforms with bandwidths less than 400 MHz, applying real-time signal processing within the waveform digitizer will increase the equivalent sample rate to 20 GHz (50 psec resolution). FIG. 13 illustrates the equivalent time sampling approach. As shown in the figure, when the waveform digitizer is in normal mode the distance between samples is periodic and non-random (ADC sample period). However, when the waveform digitizer is in equivalent (or random Interleaved) Sampling mode the equivalent time sample rate increases for repetitive signals by combining several triggered waveforms. The trigger (i.e., ADC Sample Clock) is set up so that the trigger time occurs randomly between the actual sample rate, allowing the user to simulate a much faster sample rate. The user selects the desired effective sample rate as an integer multiple of the ADC sample period (1 GHz, 2 GHz, etc.) up to a maximum of 20 GHz. The software will divide the sample period up into equidistant "bins" centered about the ADC Trigger and set up the appropriate memory for storing the waveform samples. In operation, the ADC will capture a sample, measure the time between the ADC Trigger and the actual sample time and identify the appropriate sample bin. If an ADC sample has not been stored in the bin, the sample will be stored in waveform memory specific to that bin and the ADC will capture the next sample. If a sample has been already stored in the bin, the ADC will discard the sample. This process will repeat until every bin has a valid sample. Upon completion, the waveform memory will be transferred to the FPGA processing module for additional processing.

Referring again to FIG. 14, additional signal processing can be implemented in the FPGA signal processing module 1408 to further improve the sample period resolution. After the waveform digitizer completes the effective sample process, the stored waveform in the digitizer with an effective sample period of 50 psec is transferred to the FPGA module 1408 and 50:1 interpolation is applied to the waveform resulting in an effective sample period of 1 psec. The result is passed on to the data/display processor 1410 where the pulse width, rise time, fall time and other waveform metrics are calculated.

Repetitive time-domain waveforms exceeding 400 Hz of analog bandwidth (for example fast rise time pulsed RF signals) require emulating the legacy MTA measurement approach where the time-domain waveform is reproduced using harmonic sampling and reconstruction. This multi-step process is as follows:

1. The SI-MTA performs a spectral scan to determine the fundamental frequency of the time-domain signal.
2. Based on the fundamental frequency the SI-MTA performs a harmonic analysis that measures and stores in memory the amplitude and phase for each harmonic out to 26.5 GHz
3. The equivalent time-domain waveform is reconstructed using the results of the harmonic analysis
4. The time-domain waveform characteristics are calculated.

The SI-MTA 1500 supports the legacy MTA waveform sample mode.

Figure 16:
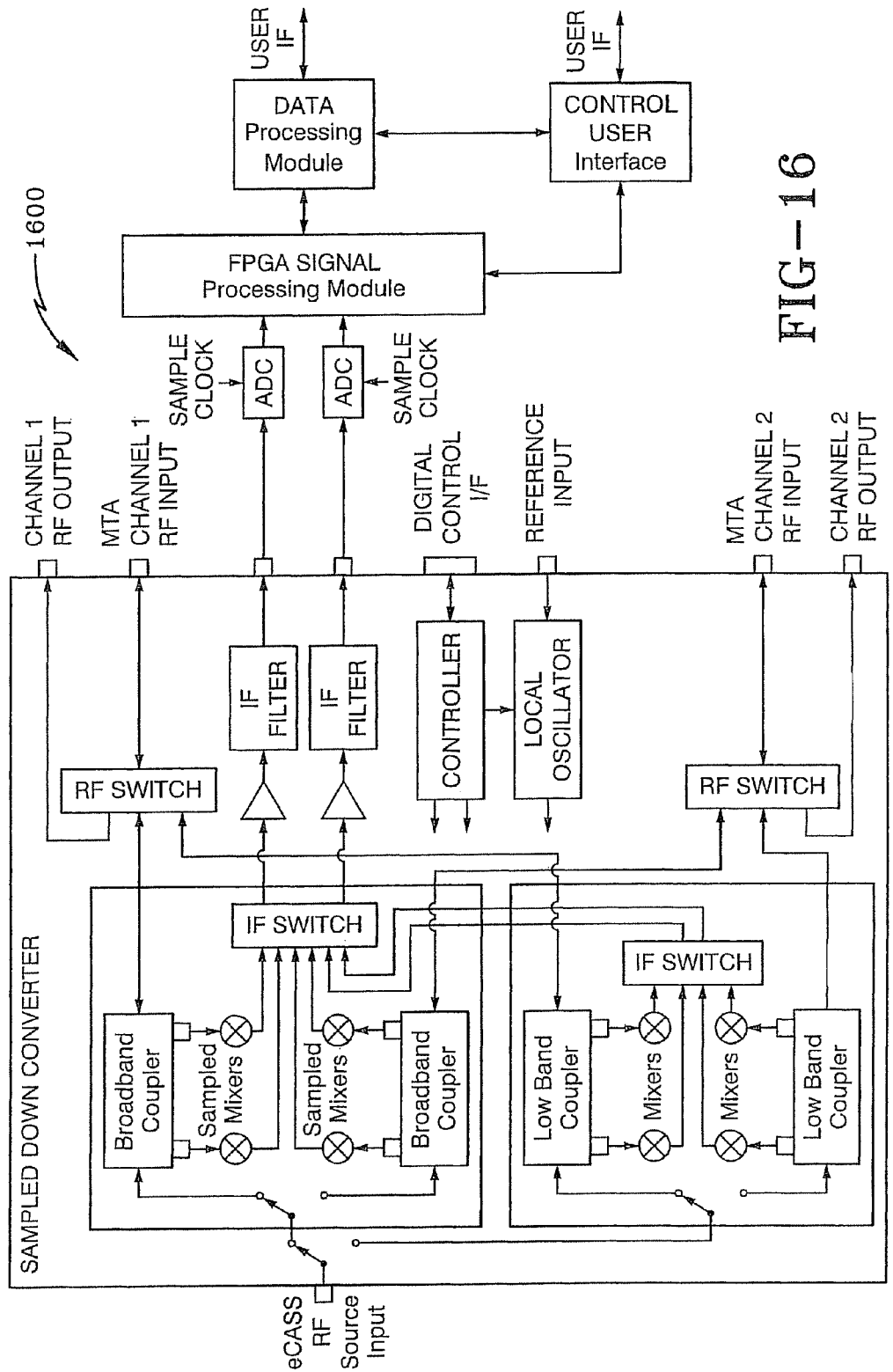
FIG. 16 is a schematic showing SIU configured for the network analysis measurements according to one configuration of the preferred embodiment of the present invention.

FIG. 16 shows the SIU 1600 configured for the network analysis measurements.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

What is claimed is:

1. A system comprising:
    a reconfigurable synthetic instrument unit comprising:
    at least one input port;
    at least one output port;
    conditioning logic to condition an input signal from the at least one input port to produce a conditioned signal;
    a radio frequency (RE) down converter to selectively down convert the conditioned signal to produce a down converted signal;
    a sampled RF down converter to selectively sample the conditioned signal to produce a sampled signal;
    a pair of narrowband analog-to-digital (A/D) converters, wherein each of the narrowband A/D converters is configured to convert at least one signal of the group of the conditioned signal, the down converted signal and the sampled signal to produce a narrowband digital signal;
    a pair of broadband A/D converters, wherein each of the broadband A/D converters is configured to convert at least one signal of the group of the conditioned signal, the down converted signal and the sampled signal to produce a broadband digital signal; and
    signal processing logic to perform digital signal processing on at least one of the broadband digital signal and the narrow band digital signal, wherein digital components within the signal processing logic are configured to be connected together in a plurality of different configurations, wherein the conditioning logic, the RD down converter, the sampled RF down converter, the pair of narrowband A/D converters, the pair of broadband A/D converters and the signal processing logic include the ability to be configured to perform spectrum analysis at one time and include the ability to be configured at different time as a microwave transition analyzer (MTA).

2. The synthetic instrument unit of claim 1 wherein the signal processing logic is configured to perform Fast Fourier Transform (FFT) based spectrum analysis and later is configured to perform as an analog swept frequency spectrum analyzer.

3. The synthetic instrument unit of claim 1 wherein the synthetic instrument unit is configured as the MTA by coupling the synthetic instrument unit with a dual-channel RF sampled down converter (SDC).

4. The synthetic instrument unit of claim 3 wherein the synthetic instrument unit is configured as the MTA and is configured to measure vector based signals.

5. The synthetic instrument unit of claim 4 wherein the synthetic instrument unit is configured to measure at least one of the group of: vector amplitude, phase difference, vector power, forward transmission and forward reflection.

6. The synthetic instrument unit of claim 1 further comprising:
    extensions for Instrumentation (PXI) Express™ chassis with at least one peripheral component interconnect PCI Express™ bus, wherein the synthetic instrument unit is coupled to the PCI Express™ bus.

7. The synthetic instrument unit of claim 6 further comprising:
    a bridge coupling the PXI Express™ chassis to the synthetic instrument unit for remote communication and control of the synthetic instrument unit.

8. The synthetic instrument unit of claim 6 further comprising:
    an embedded controller to support real-time control of the PXI chassis.

9. The synthetic instrument unit of claim 8 wherein the embedded controller further comprises:
    a removable hard drive with memory accessible by the synthetic instrument unit.

10. The synthetic instrument unit of claim 1 wherein the RF down converter is a Phase Matrix™ (PMI) down converter configured to translate the conditioned signal to at least one of the group of: a wideband intermediate frequency (IF) and a narrowband IF.

11. The synthetic instrument unit of claim 1 wherein the conditioning logic is configured to perform at least one of the group of: signal path switching, pre-selection filtering and gain control.

12. The synthetic instrument unit of claim 1 further comprising:
    a software defined graphical user interface (GUI) logic configured to generate controls on a display comprising at least one of the group of: graphical buttons, graphical knobs and graphical displays, wherein the GUI logic is configured to change the controls on the display based on a configuration of the synthetic instrument unit.

13. The synthetic instrument unit of claim 1 wherein the input signal is within the frequency range between 0 Hz to 26.5 GHz.

14. The synthetic instrument unit of claim 1 wherein the synthetic instrument unit is configured to be controlled by a station controller over a local area network (LAN).

15. The synthetic instrument unit of claim 1 wherein the signal processing logic further comprises:
    a memory, wherein the signal processing logic is configured to store down-converted digitized data in the memory so that the signal processing logic reads the data from the memory multiple times to apply different algorithms to the data at different times.

16. The synthetic instrument unit of claim 1 wherein the synthetic instrument unit includes the ability to be configured as an electronic consolidated air support system (eCASS) RF measurement system.

17. The synthetic instrument unit of claim 1 further comprising:
    clock generation logic for generating clocks.

18. The synthetic instrument unit of claim 1 further comprising:
    a radio frequency (RE) source port,
    an auxiliary (Aux) input port; and
    an RF input Channel 1 port.

19. The synthetic instrument unit of claim 1 wherein the signal processing logic includes a digital signal processor (DSP) configured to execute DSP software instructions.

20. A system comprising:
  a reconfigurable synthetic instrument unit comprising:
    a reconfigurable input module comprising:
      at least one input port
      at least one output port; and
      conditioning logic configured to condition an input signal from the at least one input port to produce a conditioned signal;
    a radio frequency (RF) down converter configured to selectively down convert the conditioned signal to produce a down converted signal;
    a sampled RF down converter configured to selectively sample the conditioned signal to produce a sampled signal;
    a pair of narrowband analog-to-digital (A/D) converters, wherein each of the narrowband A/D converters is configured to convert at least one signal of the group of the conditioned signal, the down converted signal and the sampled signal to produce a narrowband digital signal;
    a pair of broadband A/D converters, wherein each of the broadband A/D converters is configured to convert at least signal one of the group of the conditioned signal, the down converted signal and the sampled signal to produce a broadband digital signal; and
  signal processing logic configured to perform digital signal processing on at least one of the broadband digital signal and the narrow band digital signal, wherein the reconfigurable synthetic instrument unit has the ability to be configured in a first configuration at a first time to perform a first analysis of the input signal, and wherein the reconfigurable synthetic instrument unit has the ability to be configured in a second configuration at a second time to perform a second analysis of the input signal that is different than the first analysis.

* * * * *

UNITED STATES PATENT AND TRADEMARK OFFICE
CERTIFICATE OF CORRECTION

PATENT NO. : 8,514,919 B2  
APPLICATION NO. : 13/126,127  
DATED : August 20, 2013  
INVENTOR(S) : Anthony J. Estrada et al.

Page 1 of 1

It is certified that error appears in the above-identified patent and that said Letters Patent is hereby corrected as shown below:

In the Claims

Column 17, line 28 (Claim 1) change the phrase "a radio frequency (RE) down" to --a radio frequency (RF) down--

Column 17, line 48 (Claim 1) change the phrase "the RD down" to --the RF down--

Signed and Sealed this  
Twenty-fourth Day of December, 2013

Margaret A. Focarino  
*Commissioner for Patents of the United States Patent and Trademark Office*